(12) United States Patent
Kondo et al.

(10) Patent No.: US 6,859,155 B2
(45) Date of Patent: Feb. 22, 2005

(54) DATA PROCESSING DEVICE

(75) Inventors: Tetsujiro Kondo, Tokyo (JP); Kazutaka Ando, Kanagawa (JP); Koji Ohta, Tokyo (JP)

(73) Assignee: Sony Corporation, Tokyo (JP)

(*) Notice: Subject to any disclaimer, the term of this patent is extended or adjusted under 35 U.S.C. 154(b) by 95 days.

(21) Appl. No.: 10/168,266

(22) PCT Filed: Oct. 12, 2001

(86) PCT No.: PCT/JP01/08970

§ 371 (c)(1),
(2), (4) Date: Jun. 17, 2002

(87) PCT Pub. No.: WO02/35848

PCT Pub. Date: May 2, 2002

(65) Prior Publication Data

US 2003/0001757 A1 Jan. 2, 2003

(30) Foreign Application Priority Data

Oct. 19, 2000 (JP) ................... P2000-319418

(51) Int. Cl.[7] .............................................. H03M 7/00
(52) U.S. Cl. ........................................ 341/106; 341/50
(58) Field of Search .................................. 341/50–107

(56) References Cited

U.S. PATENT DOCUMENTS

| | | | | |
|---|---|---|---|---|
| 5,440,404 A | * | 8/1995 | Okamoto | 382/246 |
| 5,475,388 A | * | 12/1995 | Gormish et al. | 341/107 |
| 5,739,779 A | * | 4/1998 | Kunisa et al. | 341/59 |
| 5,835,034 A | * | 11/1998 | Seroussi et al. | 341/65 |
| 5,914,680 A | * | 6/1999 | Murashita | 341/107 |
| 5,945,930 A | * | 8/1999 | Kajiwara | 341/50 |
| 6,005,643 A | | 12/1999 | Morimoto et al. | |
| 6,031,871 A | * | 2/2000 | Schouhamer Immink | 375/240 |
| 6,052,205 A | * | 4/2000 | Matsuura | 358/426.12 |
| 6,188,338 B1 | * | 2/2001 | Yokose | 341/65 |
| 6,219,457 B1 | * | 4/2001 | Potu | 382/246 |
| 6,384,750 B1 | * | 5/2002 | Brown | 341/106 |
| 6,420,982 B1 | * | 7/2002 | Brown | 341/106 |
| 6,492,920 B2 | * | 12/2002 | Oki et al. | 341/106 |

FOREIGN PATENT DOCUMENTS

| | | |
|---|---|---|
| EP | 0 993 200 | 4/2000 |
| EP | 1 005 230 | 5/2000 |
| JP | 10-322222 | 12/1998 |
| JP | 11-69134 | 3/1999 |
| JP | 2000-165644 | 6/2000 |
| JP | 2000-184181 | 6/2000 |
| JP | 2000-224046 | 8/2000 |

* cited by examiner

Primary Examiner—Michael Tokar
Assistant Examiner—Linh V Nguyen
(74) Attorney, Agent, or Firm—Frommer Lawrence & Haug LLP; William S. Frommer

(57) ABSTRACT

The present invention relates to a data processing apparatus. Additional information is embedded in coded data obtained by encoding image data, without increasing the amount of the coded data, and the data in which the additional information is embedded is correctly decoded into the image data and the additional information. An embedded compression encoder 11 encodes image data according to a predetermined coding rule, and destroys the coding rule based on additional information, thereby embedding the additional information. A decoder 12 restores the embedded coded data, obtained by embedding the additional information in the coded data, into the coded data encoded according to the coding rule, thereby decoding the additional information and also decoding the coded data into the image data.

55 Claims, 32 Drawing Sheets

FIG. 4

(A) FREQUENCY TABLE

| PIXEL VALUE | FREQUENCY |
|---|---|
| 0 | 5 |
| 1 | 4 |
| 2 | 3 |
| 3 | 2 |
| 4 | 1 |

(B)
[0] (5)
[1] (4)
[2] (3)
[3] (2) "1" ⟶ #1 (3)
[4] (1) "0" ↗

(C)
[0] (5)
[1] (4)
[2] (3) "1" ⟶ #2 (6)
[3] (2) "1" ⟶ #1 (3) "0" ↗
[4] (1) "0" ↗

(D)
[0] (5) "1" ⟶ #3 (9)
[1] (4) "0" ↗
[2] (3) "1" ⟶ #2 (6)
[3] (2) "1" ⟶ #1 (3) "0" ↗
[4] (1) "0" ↗

(E)
[0] (5) "1" ⟶ #3 (9) "1" ⟶ #4 (15)
[1] (4) "0" ↗
[2] (3) "1" ⟶ #2 (6) "0" ↗
[3] (2) "1" ⟶ #1 (3) "0" ↗
[4] (1) "0" ↗

(F) HUFFMAN TABLE

| PIXEL VALUE | CODED DATA |
|---|---|
| 0 | 11 |
| 1 | 10 |
| 2 | 01 |
| 3 | 001 |
| 4 | 000 |

FIG. 6

| PIXEL VALUE | FREQUENCY | CODED DATA |
|---|---|---|
| 7 | 18120 | 1100111 |
| 8 | 12951 | 0100011 |
| 9 | 10129 | 11010011 |
| 10 | 8117 | 11001000 |
| 11 | 6793 | 01110010 |
| 12 | 5941 | 110111111 |
| 13 | 5239 | 110111010 |
| 14 | 4726 | 110100001 |
| 15 | 4235 | 110011001 |
| 16 | 4209 | 110011000 |
| 17 | 3891 | 011101011 |
| 18 | 3230 | 010001010 |
| 19 | 2950 | 1101111101 |
| 20 | 2680 | 1101111000 |
| 21 | 2473 | 1101000111 |
| 22 | 2356 | 1101000100 |
| 23 | 2110 | 1100100111 |
| 24 | 2095 | 1100100110 |
| 25 | 1860 | 0111010010 |
| 26 | 1733 | 0111001100 |
| 27 | 1619 | 0100010011 |
| 28 | 1570 | 0100010001 |
| 29 | 1383 | 11011110111 |
| 30 | 1370 | 11011110101 |
| 31 | 1269 | 11011100010 |
| 32 | 1162 | 11001101110 |
| 33 | 1153 | 11001101101 |
| 34 | 1021 | 11001001001 |
| 35 | 1020 | 11001001000 |
| 36 | 929 | 01110100011 |
| 37 | 872 | 01110011100 |
| 38 | 818 | 01110000100 |
| 39 | 750 | 01000001010 |

FIG. 8

| PIXEL VALUE | FREQUENCY | CODED DATA | EMBEDDED CODED DATA | DECODED PIXEL VALUE |
|---|---|---|---|---|
| 7 | 18120 | 1100111 | 1100111 | 7 |
| 8 | 12951 | 0100011 | 0100011 | 8 |
| 9 | 10129 | 11010011 | 01110010 | 11 |
| 10 | 8117 | 11001000 | 11001000 | 10 |
| 11 | 6793 | 01110010 | 11010011 | 9 |
| 12 | 5941 | 110111111 | 110011001 | 15 |
| 13 | 5239 | 110111010 | 110111010 | 13 |
| 14 | 4726 | 110100001 | 110100001 | 14 |
| 15 | 4235 | 110011001 | 110111111 | 12 |
| 16 | 4209 | 110011000 | 010001010 | 18 |
| 17 | 3891 | 011101011 | 110011000 | 16 |
| 18 | 3230 | 010001010 | 011101011 | 17 |
| 19 | 2950 | 1101111101 | 1101111101 | 19 |
| 20 | 2680 | 1101111000 | 0111010010 | 25 |
| 21 | 2473 | 1101000111 | 0100010001 | 28 |
| 22 | 2356 | 1101000100 | 1101000100 | 22 |
| 23 | 2110 | 1100100111 | 1101000111 | 21 |
| 24 | 2095 | 1100100110 | 1100100110 | 24 |
| 25 | 1860 | 0111010010 | 1101111000 | 20 |
| 26 | 1733 | 0111001100 | 0111001100 | 26 |
| 27 | 1619 | 0100010011 | 0100010011 | 27 |
| 28 | 1570 | 0100010001 | 1100100111 | 23 |
| 29 | 1383 | 11011110111 | 01110000100 | 38 |
| 30 | 1370 | 11011110101 | 11011110101 | 30 |
| 31 | 1269 | 11011100010 | 11011100010 | 31 |
| 32 | 1162 | 11001101110 | 11001001001 | 34 |
| 33 | 1153 | 11001101101 | 11001101101 | 33 |
| 34 | 1021 | 11001001001 | 01000001010 | 39 |
| 35 | 1020 | 11001001000 | 11001001000 | 35 |
| 36 | 929 | 01110100011 | 01110100011 | 36 |
| 37 | 872 | 01110011100 | 01110011100 | 37 |
| 38 | 818 | 01110000100 | 11011110111 | 29 |
| 39 | 750 | 01000001010 | 11001101110 | 32 |

IMAGE ENCODING WITH COLOR REDUCTION

EMBEDDING BY LINE ROTATION

FIG. 31
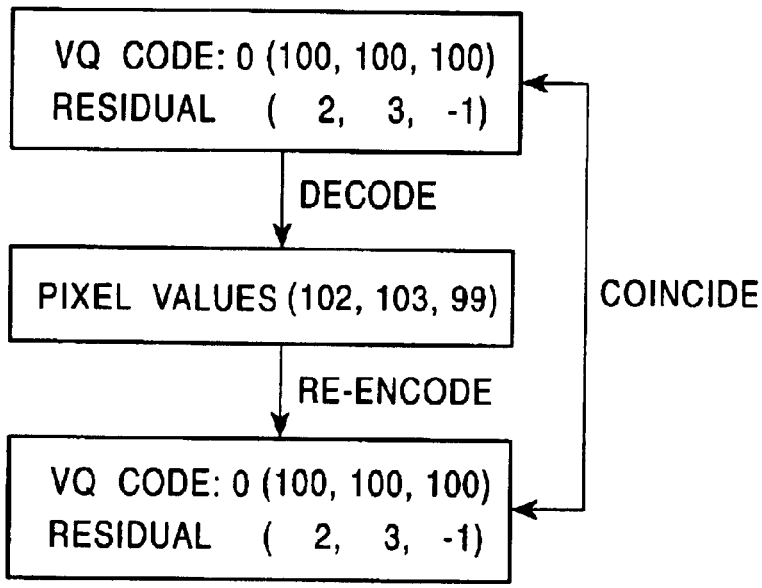
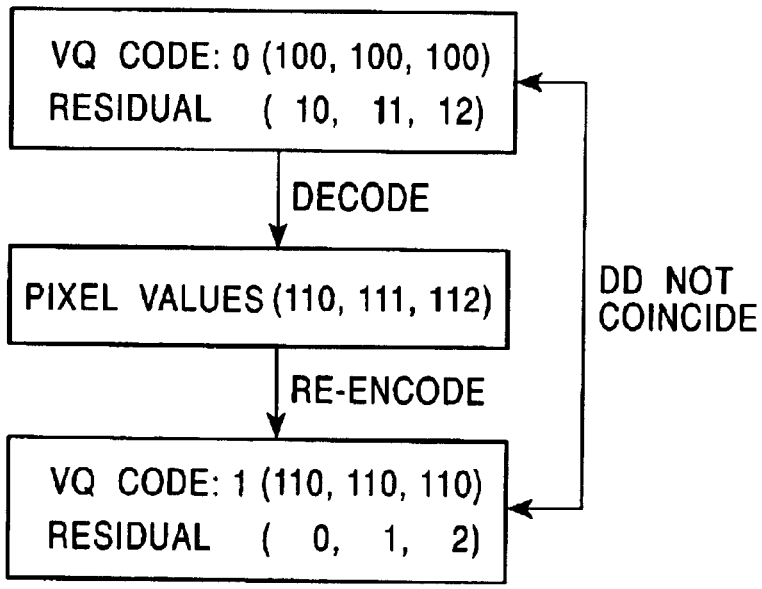

DATA PROCESSING DEVICE

TECHNICAL FIELD

The present invention relates to data processing apparatuses. More specifically, it relates to a data processing apparatus that allows information to be embedded in an image without degrading the quality of decoded image or increasing the amount of data.

BACKGROUND ART

Methods for embedding information in data without increasing the amount of the data exist, for example, changing the lowest bit or low-order two bits of digital audio data into information to be embedded. The method simply replaces lower bits of digital audio data with information to be embedded, taking advantage of the fact that the lower bits do not significantly affect the quality of sound. Thus, when the digital audio data is played back, the digital audio data with the information embedded therein is output as it is without restoring the lower bits. That is, since it is difficult to restore the lower bits, in which information is embedded, into the original digital audio data, and the lower bits do not significantly affect the quality of sound, the digital audio data is output with the information embedded therein.

According to the method described above, however, data that differs from the original data is output. Thus, considerable effect is exerted upon the sound quality when the data is audio data or upon the picture quality when the data is video data.

DISCLOSURE OF INVENTION

The present invention has been made in view of the situation described above, and it allows information to be embedded, for example, in an image without degrading the picture quality or increasing the amount of data.

A first data processing apparatus according to the present invention includes encoding means for encoding first data to output coded data; and embedding means for embedding second data in the coded data output from the encoding means by modifying a portion of the coded data based on the second data.

A first data processing method according to the present invention is such that first data is encoded to output coded data, and a portion of the coded data is modified based on the second data so that the second data is embedded in the coded data.

A first storage medium according to the present invention stores such a program that first data is encoded to output coded data, and a portion of the coded data is modified based on the second data so that the second data is embedded in the coded data.

According to the first data processing apparatus, data processing method, and storage medium of the present invention, first data is encoded to output coded data. Then, a portion of the coded data is modified based on the second data so that the second data is embedded in the coded data.

A second data processing apparatus according to the present invention includes coding table creation means for creating a coding table for encoding first data; modified coding table creation means for modifying the coding table created by the coding table creation means based on second data to create a modified coding table; and embedded coded data generation means for encoding the first data based on the modified coding table to generate embedded coded data in which the second data is embedded.

A second data processing method according to the present invention is such that a coding table for encoding first data is created, the coding table created is modified based on second data to create a modified coding table, and the first data is encoded based on the modified coding table to generate embedded coded data in which the second data is embedded.

A second storage medium according to the present invention stores such a program that a coding table for encoding first data is created, the coding table created is modified based on second data to create a modified coding table, and the first data is encoded based on the modified coding table to generate embedded coded data in which the second data is embedded.

According to the second data processing apparatus, data processing method, and storage medium of the present invention, a coding table for encoding first data is created, and the coding table created is modified based on second data to create a modified coding table. Then, the first data is encoded based on the modified coding table to generate embedded coded data in which the second data is embedded.

A third data processing apparatus according to the present invention includes tentative decoding means for tentatively decoding embedded coded data encoded by embedding second data in first data, based on a coding table, to output tentative decoded data; tentative coding table creation means for creating a tentative coding table based on the tentative decoded data; first decoded data obtaining means for decoding the embedded coded data based on the coding table and the tentative coding table to obtain first decoded data; and second decoded data obtaining means for obtaining second decoded data by comparing the coding table with the tentative coding table.

A third data processing method according to the present invention is such that embedded coded data encoded by embedding second data in first data is tentatively decoded based on a coding table to output tentative decoded data, a tentative coding table is created based on the tentative decoded data, the embedded coded data is decoded based on the coding table and the tentative coding table to obtain first decoded data, and the coding table is compared with the tentative coding table to obtain second decoded data.

A third storage medium according to the present invention stores such a program that embedded coded data encoded by embedding second data in first data is tentatively decoded based on a coding table to output tentative decoded data, a tentative coding table is created based on the tentative decoded data, the embedded coded data is decoded based on the coding table and the tentative coding table to obtain first decoded data, and the coding table is compared with the tentative coding table to obtain second decoded data.

According to the third data processing apparatus, data processing method, and storage medium of the present invention, embedded coded data encoded by embedding second data in first data is tentatively decoded based on a coding table to output tentative decoded data. Furthermore, a tentative coding table is created based on the tentative decoded data, and the embedded coded data is decoded based on the coding table and the tentative coding table to obtain first decoded data. The coding table is compared with the tentative coding table to obtain second decoded data.

A fourth data processing apparatus according to the present invention includes tentative decoding means for modifying a portion of embedded coded data encoded by embedding second data in first data according to an input parameter, and for tentatively decoding it based on a coding table to output tentative decoded data; re-encoding means for re-encoding the tentative decoded data to output re-encoded data; and decoding means for determining the parameter by comparing the embedded coded data and the re-encoded data, outputting tentative decoded data as first decoded data, obtained by tentatively decoding, based on the coding table, the embedded coded data having been partially modified by the tentative decoding means based on the parameter, and for obtaining second decoded data corresponding to the parameter.

A fourth data processing method according to the present invention is such that a portion of embedded coded data encoded by embedding second data in first data is modified according to an input parameter, and tentatively decoded based on a coding table to output tentative decoded data, the tentative decoded data is re-encoded to output re-encoded data, and the parameter is determined by comparing the embedded coded data and the re-encoded data, and tentative decoded data obtained by tentatively decoding, based on the coding table, the embedded coded data having been partially modified based on the parameter, is output as first decoded data, and for second decoded data corresponding to the parameter is also obtained.

A fourth storage medium according to the present invention stores such a program that a portion of embedded coded data encoded by embedding second data in first data is modified according to an input parameter, and tentatively decoded based on a coding table to output tentative decoded data, the tentative decoded data is re-encoded to output re-encoded data, and the parameter is determined by comparing the embedded coded data and the re-encoded data, and tentative decoded data obtained by tentatively decoding, based on the coding table, the embedded coded data having been partially modified based on the parameter, is output as first decoded data, and for second decoded data corresponding to the parameter is also obtained.

According to the fourth data processing apparatus, data processing method, and storage medium of the present invention, a portion of embedded coded data encoded by embedding second data in first data is modified according to an input parameter, and tentatively decoded based on a coding table to output tentative decoded data. Furthermore, the tentative decoded data is re-encoded to output re-encoded data. The parameter is determined by comparing the embedded coded data and the re-encoded data, and tentative decoded data obtained by tentatively decoding, based on the coding table, the embedded coded data having been partially modified based on the parameter, is output as first decoded data, and for second decoded data corresponding to the parameter is also obtained.

A fifth data processing apparatus according to the present invention includes encoding means for encoding first data according to a coding rule to output coded data; and modification means for modifying the coding rule based on second data; wherein the encoding means encodes the first data according to a coding rule modified by the modification means, thereby generating embedded coded data in which the second data is embedded.

A fifth data processing method according to the present invention is such that first data is encoded according to a coding rule to output coded data, the coding rule is modified based on second data, and the first data is encoded according to the modified coding rule to generate embedded coded data in which the second data is embedded.

A fifth storage medium according to the present invention stores such a program that first data is encoded according to a coding rule to output coded data, the coding rule is modified based on second data, and the first data is encoded according to the modified coding rule to generate embedded coded data in which the second data is embedded.

According to the fifth data processing apparatus, data processing method, and storage medium of the present invention, first data is encoded according to a coding rule to output coded data. Then, the coding rule is modified based on second data, and the first data is encoded according to the modified coding rule to generate embedded coded data in which the second data is embedded.

A sixth data processing apparatus according to the present invention includes first decoding means for decoding embedded coded data obtained by embedding second data in first data, to obtain coded data encoded according to an entropy coding rule and to obtain the second data; and second decoding means for decoding the coded data to obtain the first data.

A sixth data processing method according to the present invention is such that embedded coded data obtained by embedding second data in first data is decoded to obtain coded data encoded according to an entropy coding rule and to obtain the second data, and the coded data is decoded to obtain the first data.

A sixth storage medium according to the present invention stores such a program that embedded coded data obtained by embedding second data in first data is decoded to obtain coded data encoded according to an entropy coding rule and to obtain the second data, and the coded data is decoded to obtain the first data.

According to the sixth data processing apparatus, data processing method, and storage medium of the present invention, embedded coded data obtained by embedding second data in first data is decoded to obtain coded data encoded according to an entropy coding rule and to obtain the second data. Furthermore, the coded data is decoded to obtain the first data.

A data processing system according to the present invention includes an encoding apparatus including encoding means for encoding first data according to a coding rule to output coded data; and modification means for modifying the coding rule based on second data; wherein the encoding means encodes the first data according to a coding rule modified by the modification means to generate embedded data in which the second data is embedded, the data processing system also including a decoding apparatus including first decoding means for decoding embedded coded data to obtain the coded data encoded according to the coding rule and to obtain the second data; and second decoding means for decoding the coded data to obtain the first data.

According to the data processing system of the present invention, in the encoding apparatus, first data is encoded according to a coding rule to output coded data. Then, the coding rule is modified based on second data, and the first data is encoded according to the modified coding rule to generate embedded data in which the second data is embedded. In the decoding apparatus, embedded coded data is decoded to obtain the coded data encoded according to the coding rule and to obtain the second data. Then, the coded data is decoded to obtain the first data.

BRIEF DESCRIPTION OF THE DRAWINGS

FIG. 4 is a diagram showing variable-length decoding.

FIG. 6 is a diagram showing an example Huffman table.

FIG. 8 is a diagram showing an example of embedded coded data.

FIG. 31 is a diagram showing a process executed by the determination unit 123.

BEST MODE FOR CARRYING OUT THE INVENTION

Figure 1:
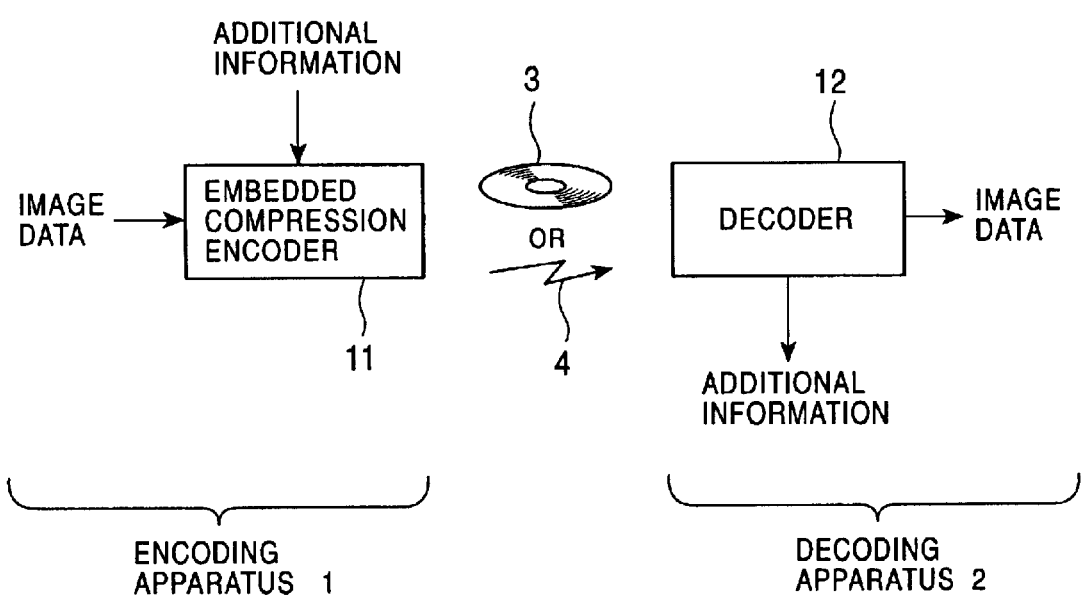
FIG. 1 is a diagram showing an example construction of an embedded compression/decoding system according to an embodiment of the present invention.

FIG. 1 is an example construction of an embedded compression/decoding system (a system refers to a logical combination of a plurality of apparatuses, irrespective of whether the constituent apparatuses resides in the same casing) according to an embodiment of the present invention.

The embedded compression/decoding system includes an encoding apparatus 1 and a decoding apparatus 2. The encoding apparatus 1 encodes, for example, an image to be encoded, and the decoding apparatus 2 decodes the result of the encoding into the original image.

The encoding apparatus 1 includes an embedded compression encoder 11. To the embedded compression encoder 11, an image to be encoded and information to be embedded in the image (hereinafter referred to as additional information when appropriate) are supplied. The embedded compression encoder 11 encodes the image (digital image data) for compression according to a predetermined coding rule, and modifies or destroys the coding rule based on the additional information (digital data), thereby embedding the additional information to yield embedded coded data for output. The embedded coded data output from the embedded compression encoder 11 is recorded on a recording medium 3, for example, a semiconductor memory, a magneto-optical disk, a magnetic disk, an optical disk, a magnetic tape, or a phase-change disk, or transmitted via a transmission medium 4, for example, a terrestrial wave, a satellite link, a CATV (Cable Television) network, the Internet, or a public network, and is thus provided to the decoding apparatus 2.

The decoding apparatus 2 includes the decoder 12, which receives the embedded coded data provided via the recording medium 3 or the transmission medium 4. The decoder 12 restores the embedded coded data into the coded data encoded according to the predetermined coding rule, thereby decoding the additional information embedded therein and also decoding the coded data into the original image. The decoded image is supplied to and displayed on a monitor, not shown, or the like.

It is to be understood that the additional information may include, for example, text data or sound data associated with the original image, a reduced version of the image, etc., and may include data irrelevant to the original image. That is, arbitrary data (including a program) can be used as the additional information.

Furthermore, part of an image supplied to the embedded compression encoder 11 for encoding may also be used as the additional information. That is, it is possible to supply part of the image as additional information to the embedded compression encoder 11 while also supplying the rest of the image as data to be encoded.

Figure 2:
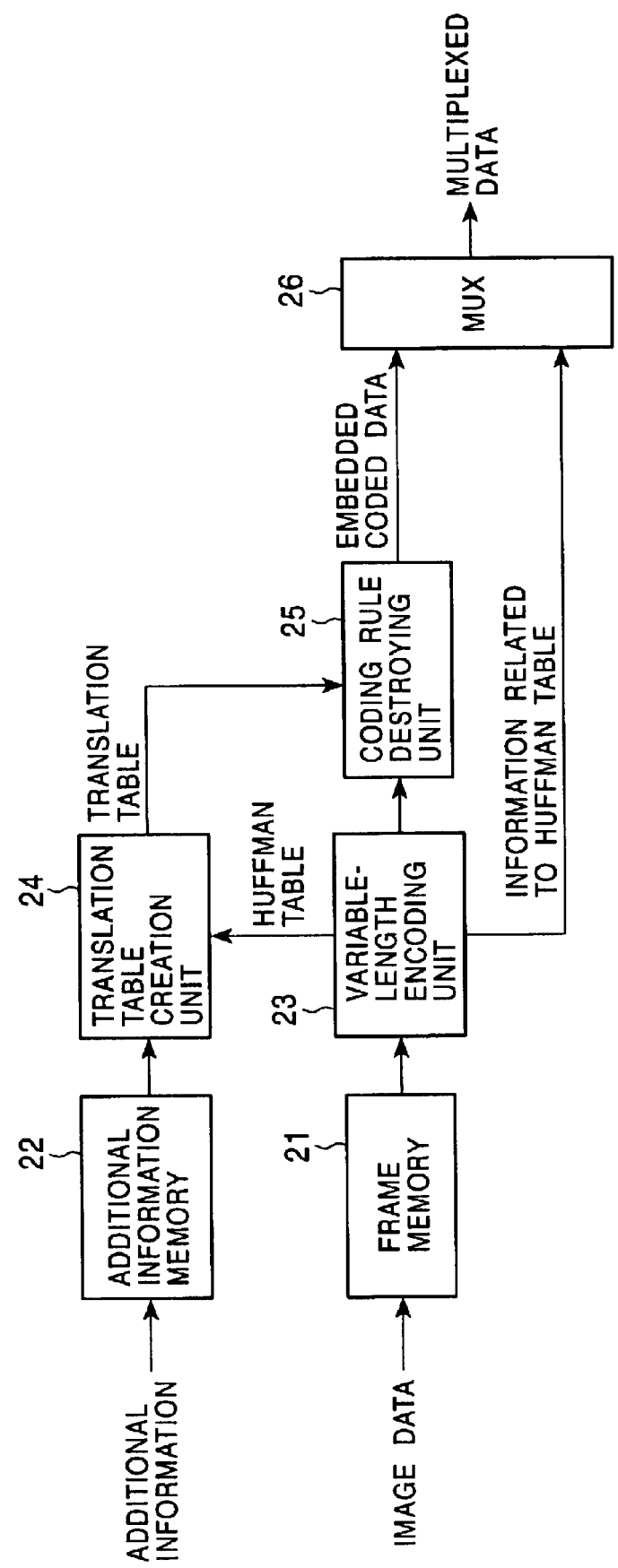
FIG. 2 is a block diagram showing a first example construction of an embedded compression encoder 11.

FIG. 2 shows an example construction of the embedded compression encoder 11 shown in FIG. 1.

A frame memory 21 stores image data supplied to the embedded compression encoder 11, for example, on a frame basis. An additional information memory 22 stores additional information supplied to the embedded compression encoder 11.

A variable-length encoding unit 23 applies variable-length coding or entropy coding, for example, Huffman coding, on the image data stored in the frame memory 21, and supplies the resulting coded data to a coding rule destroying unit 25. The variable-length encoding unit 23 creates a Huffman table in the process of Huffman encoding in a manner to be described later, and supplies the Huffman table to a translation table creation unit 24. Furthermore, the variable-length encoding unit 23 supplies information related to Huffman table, to a MUX (multiplexer) 26, which will be required in obtaining the Huffman table output to the translation table creation unit 24.

The translation table creation unit 24 creates, based on the additional information stored in the additional information memory 22, a translation table for translating codes in the Huffman table supplied from the variable-length encoding unit 23. That is, the Huffman table defines association between values to be Huffman-encoded (pixel values of the image herein) and codes having different code lengths (coded data), and the translation table creation unit 24 creates a translation table for translating the codes in the Huffman table into codes based on the additional information. The translation table created by the translation table creation unit 24 is supplied to the coding rule destroying unit 25.

The coding rule destroying unit 25 modifies or destroys the coding rule in the variable-length encoding unit 23 based on the additional information, thereby embedding the additional information. That is, the coding rule destroying unit 25 translates (manipulates) the coded data (codes) output from the variable-length encoding unit 23, according to the translation table created by the translation table creation unit 24 based on the additional information, thereby yielding coded data encoded according to a coding rule in which the coding rule in the variable-length encoding unit 23 is destroyed. The coded data encoded according to the destroyed coding rule is supplied from the coding rule destroying unit 25 to the MUX 26 as embedded coded data obtained by embedding additional information in the original coded data.

The MUX 26 multiplexes the embedded coded data from the coding rule destroying unit 25 and the information related to Huffman table from the variable-length encoding unit 23, outputting the multiplexed data. As described with reference to FIG. 1, the multiplexed data is supplied to the decoding apparatus 2 via the recording medium 3 or the transmission medium 4.

Figure 3:
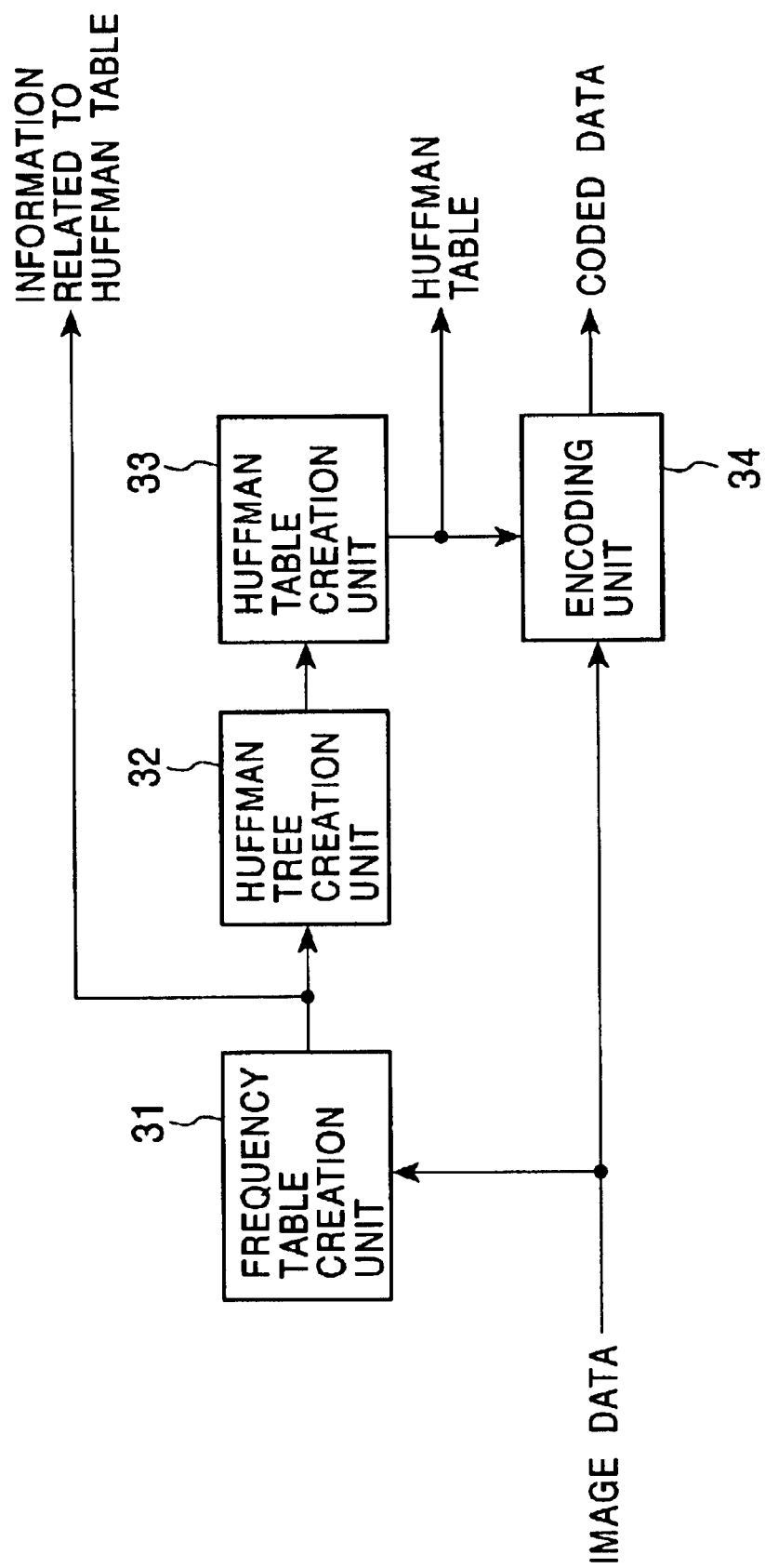
FIG. 3 is a block diagram showing an example construction of a variable-length encoding unit 23.

FIG. 3 shows an example construction of the variable-length encoding unit 23 shown in FIG. 2.

Each frame of the image data stored in the frame memory 21 shown in FIG. 2 is sequentially considered, for example, in time order, and the image data of the frame under consideration is read. The image data of the frame under consideration is supplied to a frequency table creation unit 31 and to an encoding unit 34.

The frequency table creation unit 31 creates a frequency table for the pixels constituting the frame under consideration supplied thereto, in which each pixel value is associated with the frequency of occurrence thereof, and supplies it to a Huffman tree creation unit 32. The frequency table is also supplied from the frequency table creation unit 31 to the MUX 26 shown in FIG. 3 as information related to Huffman table.

Although the frequency table is used as information related to Huffman table in the embodiment shown in FIG. 3, the information related to Huffman table is not specifically limited as long as the information allows a Huffman table created by a Huffman table creation unit 33, which will be described later, to be obtained. Thus, the information related to Huffman table may be, for example, the Huffman table itself created by the Huffman table creation unit 33, as well as the frequency table.

The Huffman tree creation unit 32 creates what is called a Huffman tree based on the frequency table supplied from the frequency table creation unit 31, and supplies it to the Huffman table creation unit 33. The Huffman table creation unit 33 creates a Huffman table based on the Huffman tree supplied from the Huffman tree creation unit 32. That is, the Huffman table creation unit 33 creates a Huffman table in which pixel values in the frame under consideration are each assigned a code having a shorter code length in accordance with the frequency of occurrence of the pixel value being higher (a code having a longer code length in accordance with the frequency of occurrence being lower). The Huffman table is supplied to the encoding unit 34 and also to the translation table creation unit 24 shown in FIG. 2.

The encoding unit 34 sequentially considers each pixel in the frame under consideration supplied thereto, for example, in order of raster scanning, and translates the pixel value of the pixel under consideration into the corresponding code in the Huffman table supplied from the Huffman table creation unit 33, outputting it as coded data.

In the variable-length encoding unit 23 constructed as described above, the frequency table creation unit 31 creates a frequency table for a frame under consideration, which is supplied to the Huffman tree creation unit 32. The Huffman tree creation unit 32 creates a Huffman tree based on the frequency table supplied from the frequency table creation unit 31, which is supplied to the Huffman table creation unit 33. The Huffman table creation unit 33 creates a Huffman table based on the Huffman tree supplied from the Huffman tree creation unit 32, which is supplied to the encoding unit 34. The encoding unit 34 translates each pixel value in the frame under consideration into a code associated with the pixel value in the Huffman table, which is output as coded data.

Now, a variable-length encoding process in the variable-length encoding unit 23 will be further described with reference to FIG. 4.

Let is be supposed, for example, that a frequency table as shown in FIG. 4(A) has been created in the frequency table creation unit 31. FIG. 4(A) shows pixel values [0], [1], [2], [3], and [4] as having occurred five times, four times, three times, twice, and once in a frame under consideration, respectively.

In relation to the frequency table in FIG. 4(A), the Huffman tree creation unit 32 creates a Huffman tree in a bottom-up manner based on the frequency of occurrence of each pixel value, for example, as shown in FIGS. 4(B) to 4(E).

More specifically, the Huffman tree creation unit 32 selects pixel values with the two lowest frequencies of occurrence from the pixel values in the frequency table, thereby forming a node. Furthermore, the Huffman tree creation unit 32 assigns either bit "0" or bit "1" to the one with the lower frequency of occurrence of the selected two pixel values, for example, "0", assigning "1" to the other. The Huffman tree creation unit 32 assigns the sum of the frequencies of occurrence of the selected two pixel values to the node formed by the selected two pixel values as the frequency of occurrence of the node.

Thus, in the frequency table shown in FIG. 4(A), pixel value [4] having a frequency of occurrence 1 and pixel value [3] having a frequency of occurrence 2 are selected, forming a node #1, and 3 (=1+2) is assigned as the frequency of occurrence of the node #1, as shown in FIG. 4(B). Furthermore, of the selected two pixel values [4] and [3], bit "0" is assigned to pixel value [4], having a lower frequency of occurrence, and bit "1" is assigned to pixel value [3], having a higher frequency of occurrence.

In FIGS. 4(B) to 4(E), numerals representing frequencies of occurrence are shown in parentheses.

If the frequencies of occurrence of the two selected pixel values are the same, bits "0" or "1" may be assigned to either one of the pixel values. However, to which of the pixel values bits "0" or "1" is to be assigned must be predetermined, for example, assigning bit "0" to the smaller pixel value.

The Huffman tree creation unit 32 repeats the same process until convergence to a single node is achieved.

Thus, from the state shown in FIG. 4(B), the node #1 and pixel value [2] each having a frequency of occurrence 3 are selected, so that the node #1 and pixel value [2] form a node #2, as shown in FIG. 4(C). Furthermore, the frequency of occurrence of the node #2 is set to 6 (=3+3), and bits "0" and "1" are assigned to the node #1 and pixel value [2], respectively.

From the state shown in FIG. 4(C), pixel value [1] having a frequency of occurrence 4 and pixel value [0] having a frequency of occurrence 5 are selected, so that pixel values [1] and [0] form a node #3. Furthermore, the frequency of occurrence of the node #3 is set to 9 (=4+5), and bits "0" and "1" are assigned to pixel values [1] and [0], respectively, as shown in FIG. 4(D).

From the state shown in FIG. 4(D), the node #2 having a frequency of occurrence 6 and the node #3 having a frequency of occurrence 9 are selected, so that the nodes #2 and #3 form a node #4. Furthermore, the frequency of occurrence of the node #4 is set to 15 (=6+9), and bits "0" and "1" are assigned to the nodes #2 and #3, respectively, as shown in FIG. 4(E).

In the state shown in FIG. 4(E), the nodes have been converged to the single node #4, so that the Huffman tree is complete. The Huffman tree creation unit 32 supplies the Huffman tree to the Huffman table creation unit 33.

The Huffman table creation unit 33 recognizes a code assigned to each pixel value by tracking the Huffman tree from the convergence node in the direction of a pixel value.

More specifically, for example, the Huffman tree shown in FIG. 4(E) is tracked from the node #4 in the direction of pixel value [0], and a sequence of bits assigned to the nodes (or pixel values) is found as "0"→"0"→"0". Accordingly, the Huffman table creation unit 33 recognizes that code "000" is assigned to pixel value [0]. Also, the Huffman tree shown in FIG. 4(E) is tracked from the node #4 in the direction of pixel value [1], and a sequence of bits assigned to the nodes is found as "0"→"0"→"1". Accordingly, the Huffman table creation unit 33 recognizes that code "001" is assigned to pixel value [1].

Similarly, the Huffman table creation unit 33 recognizes a code assigned to each pixel value, thereby creating a Huffman table representing association between pixel values and codes. Thus, from the Huffman tree shown in FIG. 4(E), a Huffman table as shown in FIG. 4(F) is created.

The variable-length encoding unit 23 may alternatively perform variable-length encoding, for example, in the manner disclosed in U.S. Pat. No. 5,021,782.

In the Huffman table shown in FIG. 4(E), codes "11", "10", "01", "001", and "000" are assigned to pixel values [0], [1], [2], [3], and [4] having frequencies of occurrence 5, 4, 3, 2, and 1, respectively. Thus, basically, codes of shorter code lengths are assigned in accordance with the frequencies of occurrence being higher.

In the Huffman table shown in FIG. 4(E), although pixel values [0], [1], [2], [3], and [4] have different frequencies of occurrence, codes in two bits are assigned to pixel values [0], [1], and [2] having relatively higher frequencies of occurrence, whereas codes in three bits are assigned to pixel values [3] and [4] having relatively lower frequencies of occurrence.

As described above, in a Huffman table, codes having the same code length are sometimes assigned to pixel values having different frequencies of occurrence. The relationship between frequencies of occurrence of pixel values and length of codes assigned to the pixel values are generally as shown in FIG. 5.

Figure 5:
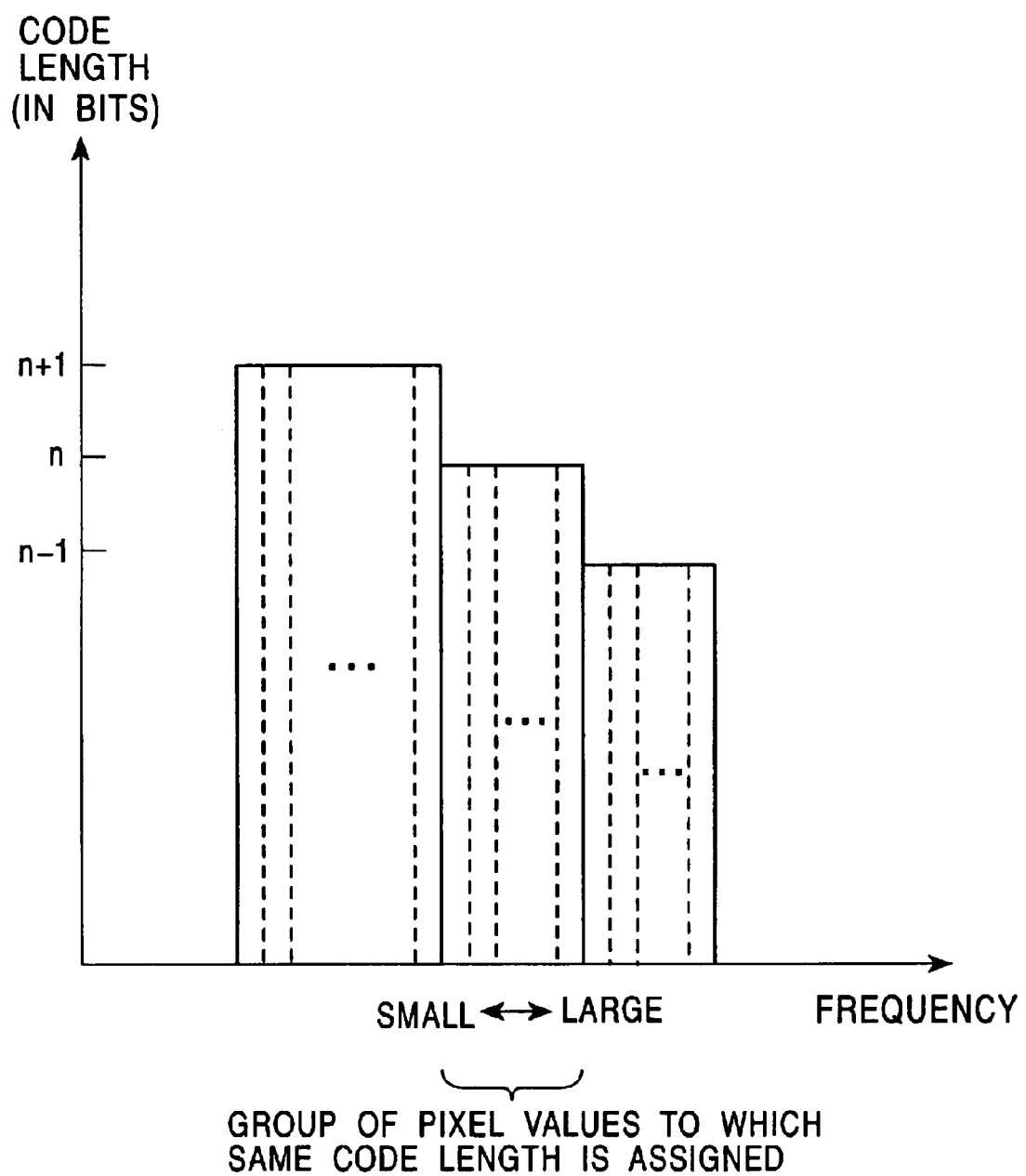
FIG. 5 is a diagram showing the relationship between the frequencies of occurrence of pixel values and code lengths of codes assigned to the pixel values.

Referring to FIG. 5, assuming that n-bit codes are assigned to x pixel values (x is an integer not exceeding $2^n$), the number of patterns of assignment of the n-bit codes to the x pixel values is X! (! denotes factorial), only one of which is adopted based on the rule for creating the Huffman tree described above.

Even if the pattern of assignment of the n-bit codes to the x pixel value is modified, the amount of codes does not increase. That is, in a Huffman table, even if an n-bit code is assigned to a pixel value instead of another n-bit code, the code length assigned remains as n bits, and thus the amount of codes does not increase.

Furthermore, even if the pattern of assignment of the n-bit codes to the x pixel values is modified, the pattern of code assignment can be restored, for example, based on the frequencies of occurrence of x pixel values.

From the above, even if the pattern of assignment of codes of the same length to pixel values is modified in a Huffman table, that is, even if a coding rule for variable-length encoding is destroyed, the amount of codes does not increase, and the modified assignment pattern can be restored to the original one.

This implies that, by modifying the pattern of assignment of codes to pixel values based on some information, information can be embedded without increasing the total amount of data while allowing the embedded information to be decoded without overhead.

FIG. 6 shows an example of a Huffman table created for pixel values represented in eight bits (0 to 255). In FIG. 6, in addition to pixel values and codes (coded data) assigned to pixel values, the frequency of occurrence of each of the pixel values is shown.

Referring to FIG. 6, for example, with regard to seven pixel values from [12] to [18], a nine-bit code is assigned to each of the seven pixel values, and thus 7! patterns of assignment of the nine-bit codes to the seven pixel values exist. Thus, by modifying the pattern of assignment of the nine-bit codes to the seven pixel values, int[$\log_2 7!$] bits of information can be embedded. int[ ] represents the largest integer value not exceeding the value in [ ].

FIG. 7(A) is a graph showing the respective frequencies of occurrence of pixel values [12] to [18] shown in FIG. 6, and FIG. 7(B) shows nine-bit codes respectively assigned to pixel values [12] to [18] in FIG. 6.

Let it be supposed that the code assignment shown in FIG. 7(B) is modified based on additional information within int[$\log_2 7!$] bits, for example, as shown in FIG. 7(C).

Figure 7:
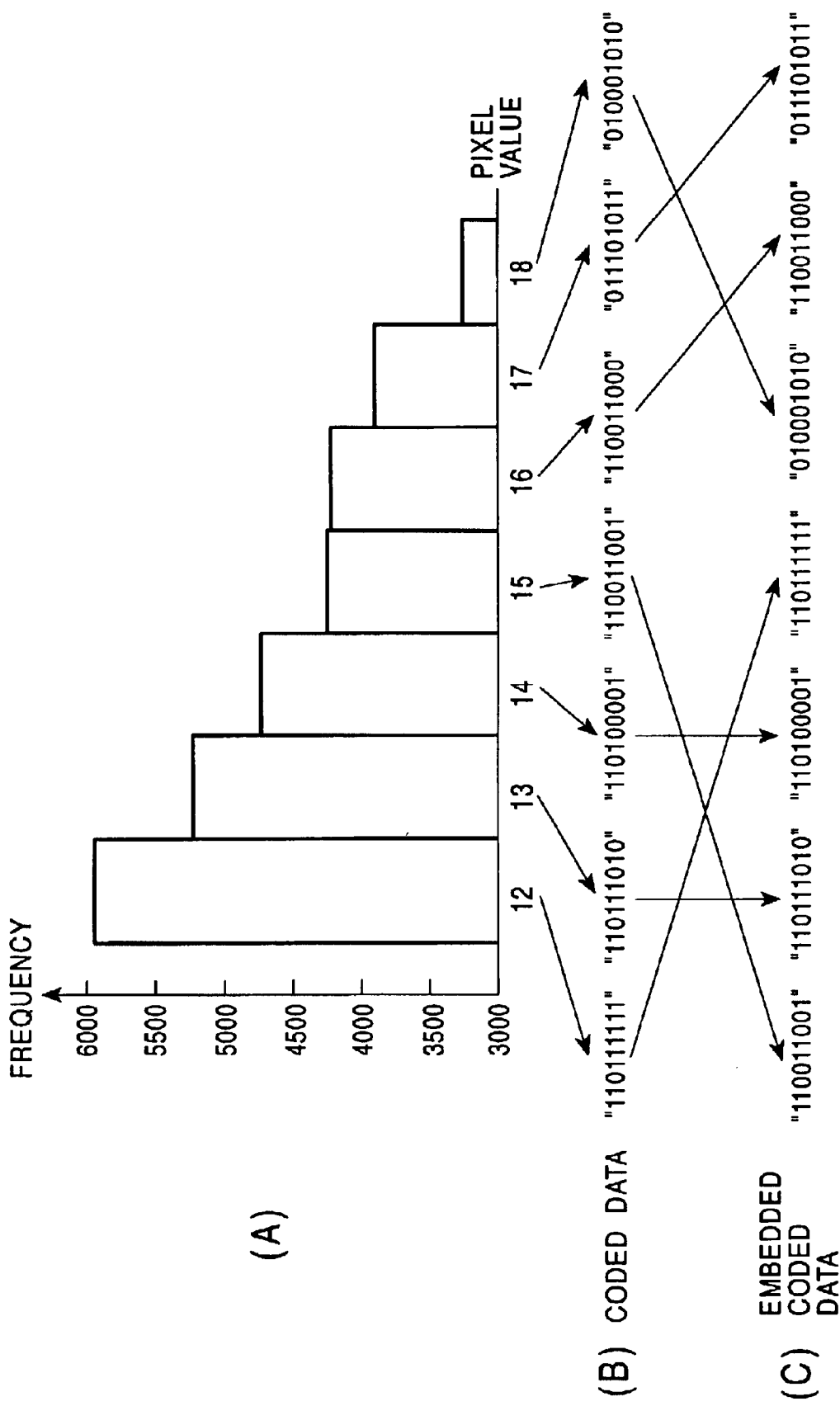
FIG. 7 is a diagram showing codes assigned in accordance with the frequencies of occurrence of pixel values, and translation of the codes.

More specifically, in FIG. 7(B), codes "110111111", "110111010", "110100001", "110011001", "11011000", "011101011", and "010001010" are assigned to pixel values [12] to [18], respectively. In FIG. 7(C), the assignment is modified so that code "110111111", which has been assigned to pixel value [12], is now assigned to pixel value [15], code "110011001", which has been assigned to pixel value [15], is now assigned to pixel value [12], code "11011000", which has been assigned to pixel value [16], is now assigned to pixel value [17], code "011101011", which has been assigned to pixel value [17], is now assigned to pixel value [18], and code "010001010", which has been assigned to pixel value [18], is now assigned to pixel value [16]. Assignment of codes to other pixel values is not modified in FIG. 7.

Also for pixel values to which codes of other code lengths are assigned, pattern of code assignment can be modified based on the additional information. FIG. 8 shows an example of embedded coded data, constituting coded data in which the pattern of code assignment shown in FIG. 6 has been modified based on the additional information. FIG. 8 shows, together with the embedded coded data, decoded pixel values obtained by variable-length decoding the embedded coded data according to the Huffman table shown in FIG. 6 (pixel values obtained by decoding the embedded coded data according to the Huffman table used in obtaining the coded data).

Figure 9:
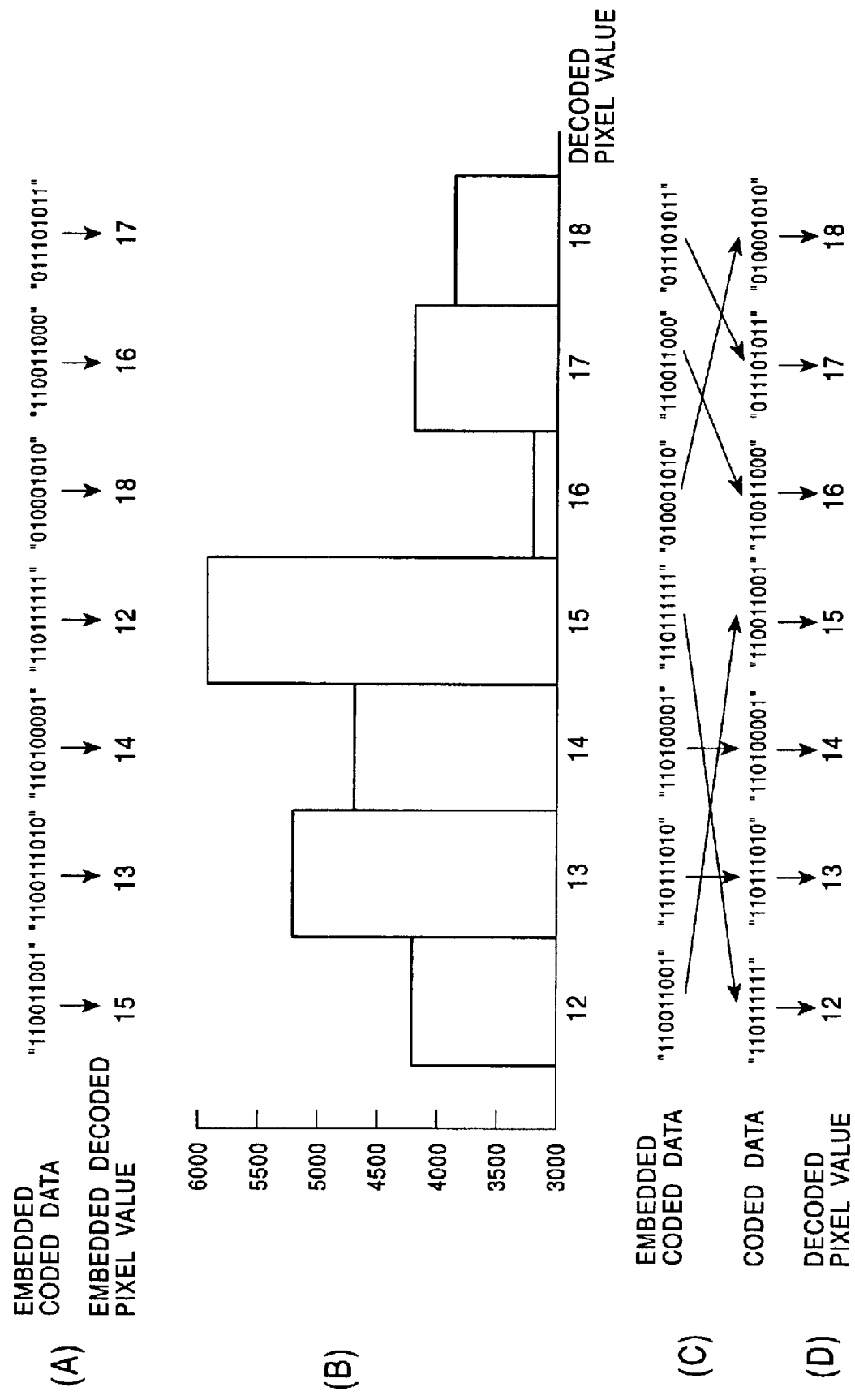
FIG. 9 is a diagram showing a method for restoring embedded coded data into original coded data.

Referring to FIG. 8, for example, with regard to the seven pixel values from [12] to [18], if the embedded coded data is decoded according to the Huffman table shown in FIG. 6, decoded pixel values as shown in FIG. 9 are obtained. That is, letting pixel values obtained by decoding the embedded coded data according to the Huffman table used at the time of encoding be referred to as embedded decoded pixel value, codes "110011001", "110111010", "110100001", "110111111", "010001010", "11011000", and "011101011" are variable-length decoded into embedded decoded pixel values [15], [13], [14], [12], [18], [16], and [17], respectively.

FIG. 9(B) shows counts of the frequencies of occurrence of the embedded decoded pixel values [12] to [18]. Since codes assigned to pixel values [12] to [18] in the Huffman table shown in FIG. 6 are modified as shown in FIGS. 7(B) and 7(C), the frequencies of occurrence of pixel values [12], [15], and [16] to [18] do not coincide with those shown in FIG. 7(A), and more specifically, they coincide with the frequencies of occurrence of pixel values [15], [12], [18], [16], and [17] prior to variable-length encoding, respectively.

However, since the frequencies of occurrence of original pixel values [12] to [18] (prior to variable-length encoding) and the frequencies of occurrence of pixel values [12] to [18] obtained by variable-length decoding are supposed to respectively coincide with each other, it is unnatural (strange) if the frequencies of occurrence differ between prior to variable-length encoding and after variable-length decoding.

Accordingly, the pattern of assignment of codes (variable-length codes), having been modified based on the additional information, can be restored to the original pattern by comparing the frequencies of occurrence of the original pixel values shown in FIG. 7(A) with the frequencies of occurrence of the embedded decoded pixel values shown in FIG. 9(B) and by detecting matching frequencies of occurrence. That is, the embedded coded data can be restored into the coded data encoded according to the Huffman table. Furthermore, the embedded additional information can be decoded based on how the pattern of code assignment is modified when the embedded coded data is restored into the coded data, and also, the original pixel values can be obtained by variable-length decoding the restored coded data.

More specifically, by comparing the frequencies of occurrence of the original pixel values shown in FIG. 7(A) with the frequencies of occurrence of the embedded decoded pixel values shown in FIG. 9(B), the frequencies of occurrence of the embedded decoded pixel values [15], [13], [14], [12], [17], [18], and [16] can be detected as coinciding with the frequencies of occurrence of the original pixel values [12] to [18], respectively.

Thus, embedded coded data "110011001", "110111010", "110100001", "110111111", "010001010", "11011000", and "011101011", from which embedded decoded pixel values [15], [13], [14], [12], [17], [18], and [16] have been obtained, can be determined as having been codes "110111111", "110111010", "110100001", "110011001", "11011000", "011101011", and "010001010" assigned to the original pixel values [12] to [18] in the Huffman table shown in FIG. 6 prior to embedding of the additional information.

Thus, by translating the embedded coded data so that the frequencies of occurrence of the original pixel values shown in FIG. 7(A) coincide with the frequencies of occurrence of the embedded decoded pixel values shown in FIG. 9(B), as shown in FIG. 9(C), the coded data encoded according to the Huffman table shown in FIG. 6 can be restored, and the additional information can be decoded based on the association between the embedded coded data and the restored coded data. Furthermore, by variable-length decoding the restored coded data, the original pixel values can be obtained, as shown in FIG. 9(D).

The embedded compression encoder 11 shown in FIG. 2 performs an embedded coding process that does not increase the amount of data and that allows decoding without overhead, as described above.

Figure 10:
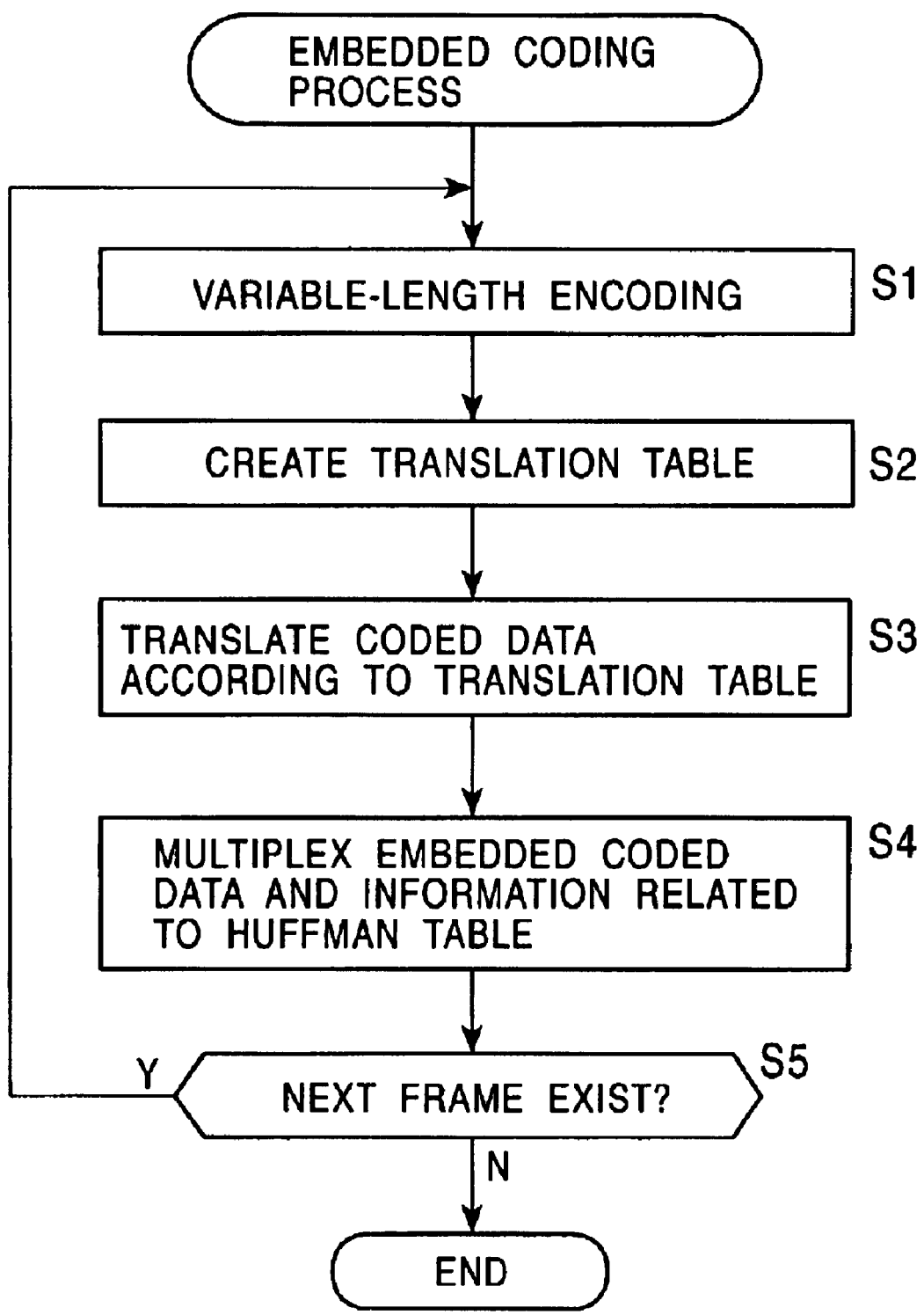
FIG. 10 is a flowchart showing an embedded coding process.

Now, an embedded coding process executed by the embedded compression encoder 11 shown in FIG. 2 will be further described with reference to a flowchart shown in FIG. 10.

In step S1, the variable-length encoding unit 23 variable-length encodes the pixel value of each pixel in a frame under consideration supplied from the frame memory 21, outputting the resulting coded data to the coding rule destroying unit 25. Furthermore, in the variable-length encoding in step S1, the variable-length encoding unit 23 (FIG. 3) outputs a frequency table created by the frequency table creation unit 31 to the MUX 26 as information related to Huffman table, and also outputs a Huffman table created by the Huffman table creation unit 33 to the translation table creation unit 24.

Then, in step S2, the translation table creation unit 24 modifies the pattern of assignment of codes having the same code length in Huffman table supplied from the variable-length encoding unit 23, based on the additional information supplied from the additional information memory 22, and executes a translation table creation process for creating a translation table associating the codes prior to the modification with codes after the modification. The translation table is supplied from the translation table creation unit 24 to the coding rule destroying unit 25.

In step S3, the coding rule destroying unit 25 executes a coded data translation process for translating the coded data supplied from the variable-length encoding unit 23 into embedded coded data according to the translation table supplied from the translation table creation unit 24, supplying the resulting embedded coded data to the MUX 26.

In step S4, the MUX 26 multiplexes and outputs the embedded coded data of the frame under consideration, supplied from the coding rule destroying unit 25, and the information related to Huffman table, supplied from the variable-length encoding unit 23. The process then proceeds to step S5.

In step S5, it is determined whether a frame next to the frame under consideration is stored in the frame memory 21. If it is determined in step S5 that a next frame is stored in the frame memory 21, with the next frame a new frame to be considered, the process returns to step S1, repeating the same process.

If it is determined in step S5 that a next frame is not stored in the frame memory 21, the embedded coding process is exited.

Figure 11:
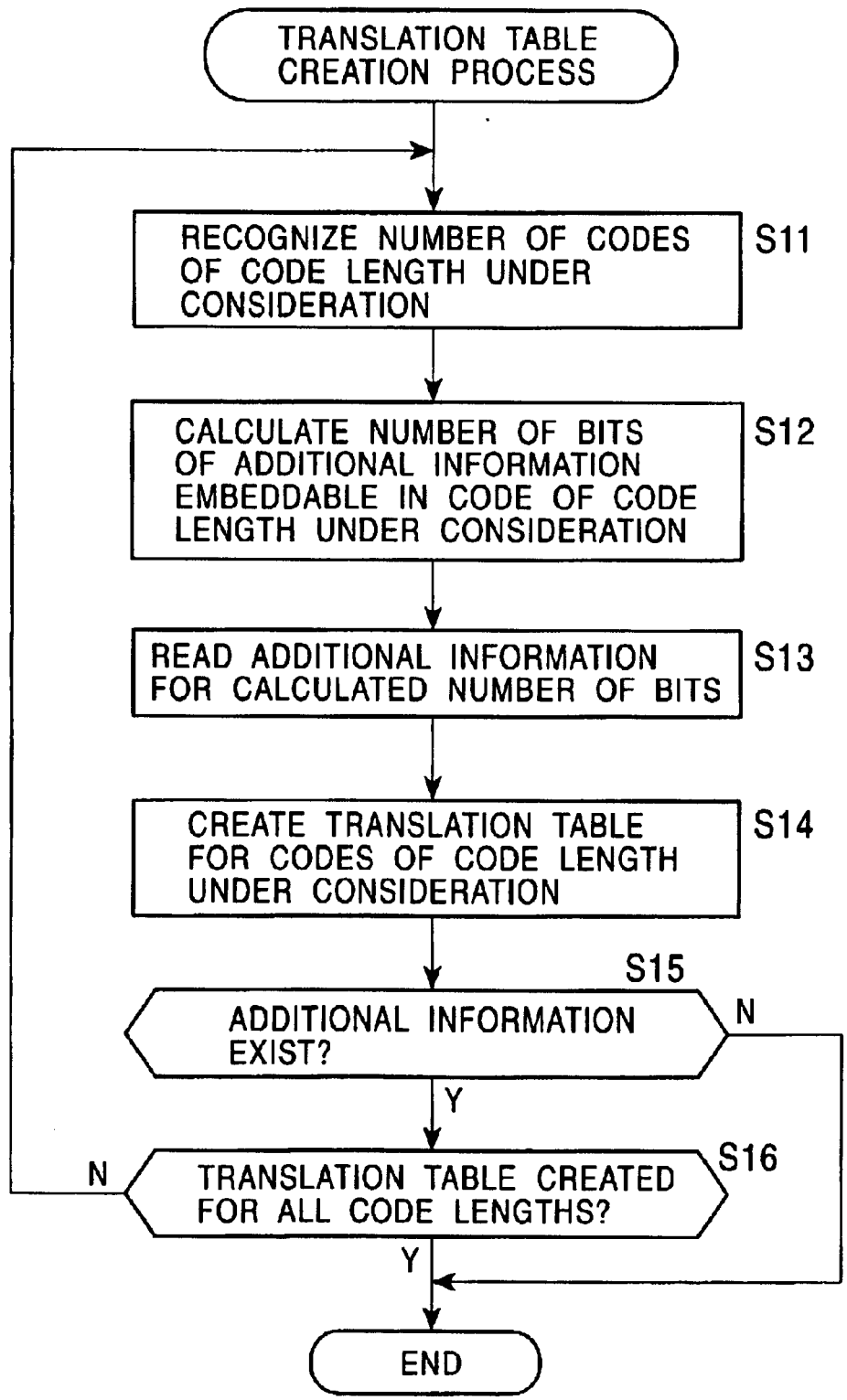
FIG. 11 is a flowchart showing a translation table creation process.

Now, the translation table creation process executed in step S2 shown in FIG. 10 by the translation table creation unit 24 shown in FIG. 2 will be further described with reference to a flowchart shown in FIG. 11.

In the translation table creation process, initially, in step S11, the translation table creation unit 24 considers a particular code length of codes in the Huffman table supplied from the variable-length encoding unit 23, recognizing the number of codes having the code length under consideration. That is, the translation table creation unit 24 recognizes the number of codes having the same code length as the code length under consideration.

In step S12, the translation table creation unit 24 calculates the number of bits of additional information that can be embedded in the codes having the code length under consideration, based on the number of codes having the code length under consideration, recognized in step S11. That is, letting the number of codes having the code length under consideration be denoted by x, the translation table creation unit 24 obtains the number of bits y of additional information that can be embedded, by calculating $y=int[\log_2(X!)]$.

The process then proceeds to step S13, in which the translation table creation unit 24 reads the additional information for the number of bits y, calculated in step S12, from the additional information memory 22. The process then proceeds to step S14. In step S14, the translation table creation unit 24 creates a translation table for the codes having the code length under consideration, based on the additional information read from the additional information memory 22 in step S13. That is, the translation table creation unit 24 modifies the pattern of assignment of x codes having the code length under consideration to pixel values, based on the y-bit additional information, thereby creating a translation table for the codes having the code length under consideration, in which the codes prior to the modification are associated with codes after the modification.

Then, in step S15, the translation table creation unit 24 determines whether further additional information is stored in the additional information memory 22. If it is determined that none is stored, the translation table creation unit 24 outputs translation tables created so far for the frame under consideration to the coding rule destroying unit 25 (FIG. 2). The translation table creation process is then exited.

If it is determined in step S15 that further additional information is stored in the additional information memory 22, the process proceeds to step S16, in which the translation table creation unit 24 determines whether a translation table has been created for codes of each code length in the Huffman table. If it is determined that the creation is not complete, the process returns to step S11. In this case, in step S11, one of the code lengths for which a translation table has not been created is selected as a new code length to be considered, and then the same process is repeated.

If it is determined in step S16 that a translation table has been created for codes of each code length in the Huffman table, the translation table creation process is exited.

Figure 12:
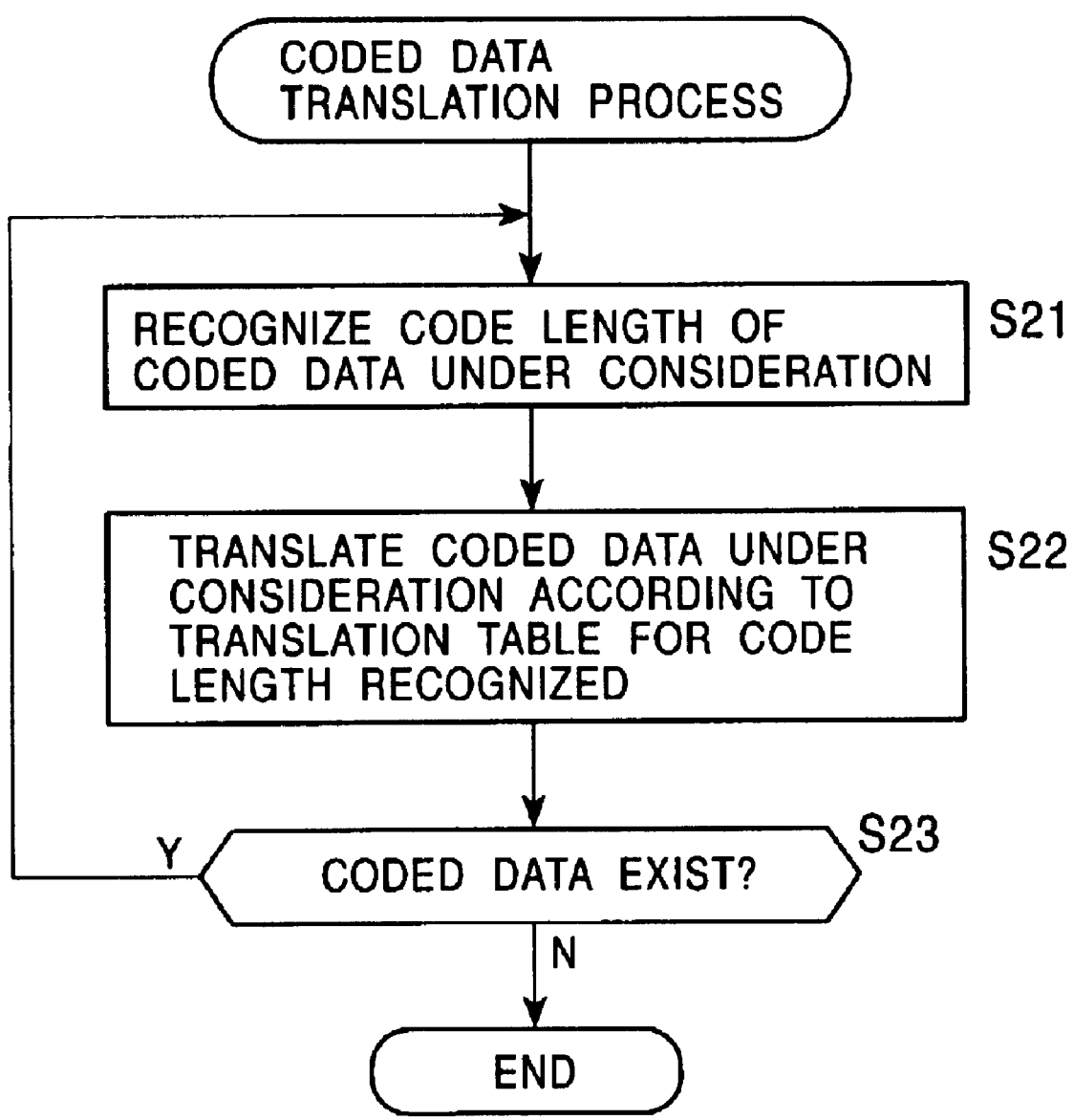
FIG. 12 is a flowchart showing a coded data translation process.

Next, the coded data translation process executed in step S3 shown in FIG. 10 by the coding rule destroying unit 25 shown in FIG. 2 will be further described with reference to a flowchart shown in FIG. 12.

As described above, the variable-length encoding unit 23 considers each pixel in the frame under consideration in order of raster scanning, and variable-length encodes the pixel value of the pixel under consideration, sequentially outputting the resulting coded data. Letting the coded data output for the pixel under consideration by the variable-length encoding unit 23 be referred to as coded data under consideration, initially, in step S21, the coding rule destroying unit 25 recognizes the code length of the coded data under consideration. The process then proceeds to step S22.

In step S22, the coding rule destroying unit 25 translates the coded data under consideration according to the translation table associated with the code length of the coded data under consideration, recognized in step S21, and outputs the result to the MUX 26 (FIG. 2) as embedded coded data.

The process then proceeds to step S23, in which the coding rule destroying unit 25 determines whether next coded data supplied from the variable-length encoding unit 23 exits. If it is determined that next coded data exists, the coding rule destroying unit 25 selects the next coded data as new coded data to be considered. The process then returns to step S21, repeating the same process.

If it is determined in step S23 that next coded data does not exist, the coded data translation process is exited.

The embedded compression encoder 11 shown in FIG. 2 yields embedded coded data, in which additional information is embedded, by translating, according to a translation table, coded data yielded by variable-length encoding in the variable-length encoding unit 23. Alternatively, for example, the variable-length encoding unit 23 may create a Huffman table in which the association of pixel values with codes is modified (hereinafter referred to as modified Huffman table when appropriate) and use the modified Huffman table to simultaneously perform variable-length encoding and embedding of additional information. That is, the variable-length encoding unit 23 may perform variable-length encoding based on a destroyed coding rule.

Figure 13:
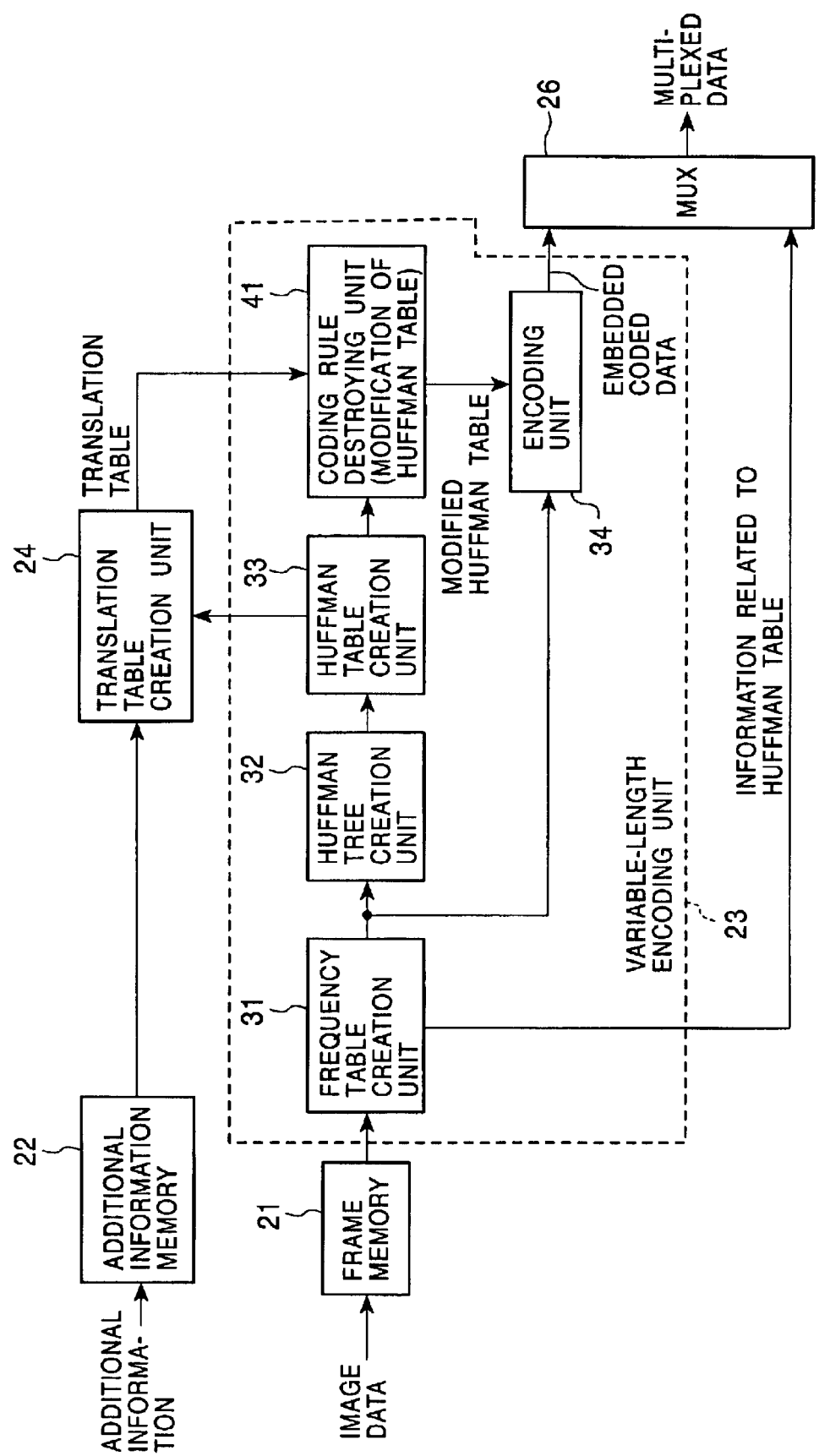
FIG. 13 is a block diagram showing a second example construction of the embedded compression encoder 11.

FIG. 13 shows an example construction of the embedded compression encoder 11 that executes such an embedded coding process. In the figure, parts corresponding to those shown in FIG. 2 or FIG. 3 are designated by the same numerals, and descriptions thereof will hereinafter be omitted as appropriate. The embedded compression encoder 11 shown in FIG. 13 does not include the coding rule destroying unit 25; instead, a coding rule destroying unit 41 is included in the variable-length encoding unit 23. The embedded compression encoder 11 is otherwise constructed the same as shown in FIG. 2.

To the coding rule destroying unit 41, a Huffman table output from the Huffman table creation unit 33 and a translation table output from the translation table creation unit 24 are supplied.

The coding rule destroying unit 41 modifies codes (coded data) associated with pixel values in the Huffman table into embedded coded data associated with the codes in the translation table, thereby modifying the Huffman table supplied from the Huffman table creation unit 33 into a modified Huffman table in which the pixel values are associated with the embedded coded data. The modified Huffman table is supplied to the encoding unit 34, which translates the pixel values according to the modified Huffman table.

Thus, in FIG. 13, the encoding unit 34 outputs the embedded coded data.

Figure 14:
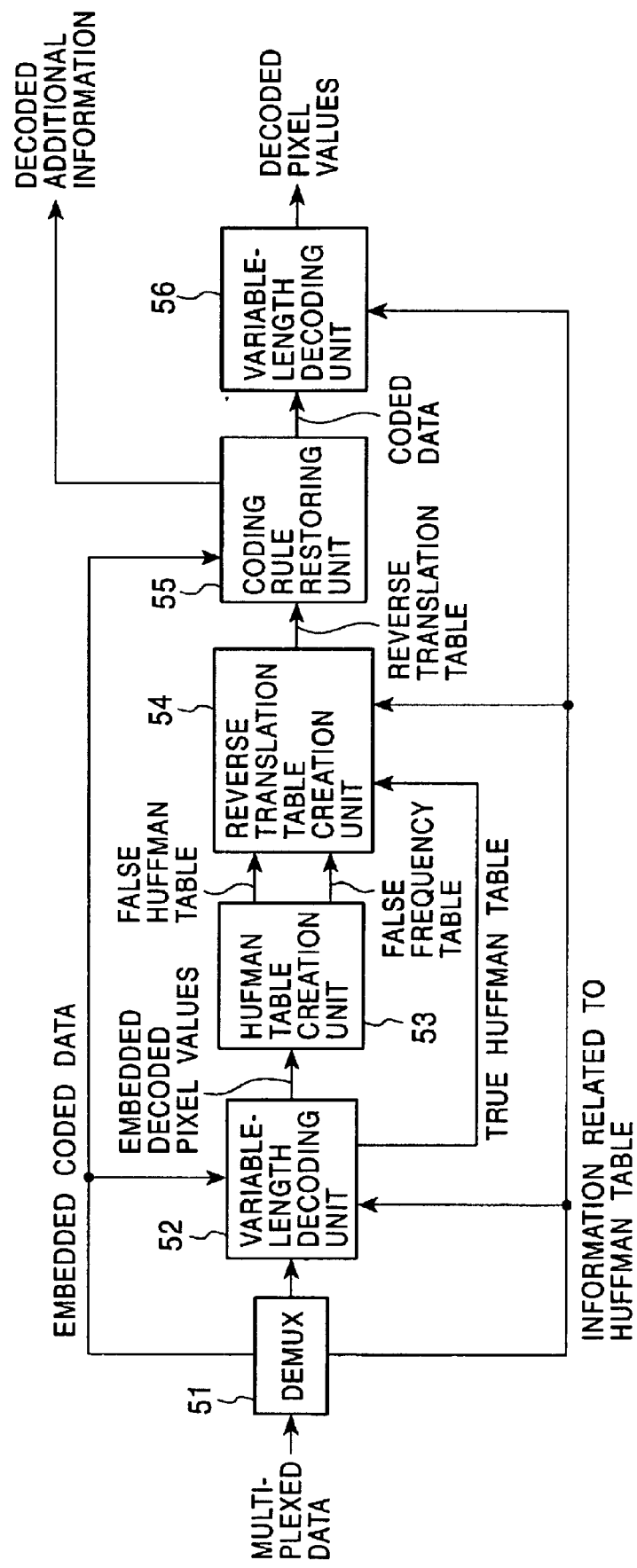
FIG. 14 is a block diagram showing a first example construction of a decoder 12.

FIG. 14 shows an example construction of the decoder 12 shown in FIG. 1, in a case where the embedded compression encoder 11 is constructed as shown in FIG. 2 or FIG. 13.

A DEMUX (demultiplexer) 51 demultiplexes, on a frame basis, data provided from the embedded compression encoder 11 shown in FIG. 2 or FIG. 13 into embedded coded data and information related to Huffman table, supplying the embedded coded data for each frame to a variable-length decoding unit 52 and to a coding rule restoring unit 55 while supplying the information related to Huffman table to the variable-length decoding unit 52, a reverse translation table creation unit 54, and to a variable-length decoding unit 56.

The variable-length decoding unit 52 sequentially considers each frame of the embedded coded data and the information related to Huffman table output from the DEMUX 51, and creates a Huffman table based on a frequency table constituting the information related to Huffman table associated with the frame under consideration, in the same manner as in the variable-length encoding unit 23 shown in FIG. 3, supplying it to the reverse translation table creation unit 54.

The Huffman table created from the frequency table constituting the information related to Huffman table is the same one as that used for variable-length encoding in the variable-length encoding unit 23, and will hereinafter be referred to as a true Huffman table when appropriate. The frequency table constituting the information related to Huffman table, used to obtain the true Huffman table, will hereinafter be referred to as a true frequency table when appropriate.

The variable-length decoding unit 52 then variable-length decodes the embedded coded data of the frame under consideration according to the true Huffman table, and supplies the resulting decoded pixel values, that is, embedded decoded pixel values, to the Huffman table creation unit 53.

The Huffman table creation unit 53 creates a Huffman table for variable-length encoding the embedded decoded pixel values of the frame under consideration, supplied from the variable-length decoding unit 52, and supplies the Huffman table and the frequency table created in the process of creating the Huffman table to the reverse translation table creation unit 54.

The Huffman table created by the Huffman table creation unit 53 is used for variable-length encoding the embedded decoded pixel values (obtained by variable-length decoding the embedded coded data according to the true Huffman table), and basically does not allow correct decoding of coded data. Thus, the Huffman table obtained from the embedded decoded pixel values will hereinafter be referred to as a false Huffman table when appropriate, as opposed to the true Huffman table. The frequency table used for obtaining the false Huffman table will hereinafter be referred to as a false frequency table when appropriate, as opposed to the true frequency table.

The reverse translation table creation unit 54 creates a reverse translation table for translating the embedded coded data into the original coded data, based on the true Huffman table supplied from the variable-length decoding unit 52, the true frequency table constituting the information related to Huffman table, supplied from the DEMUX 51, and the false Huffman table and the false frequency table supplied from the Huffman table creation unit 53. That is, the reverse translation table creation unit 54 creates the same reverse translation table as the translation table created by the translation table creation unit 24 shown in FIG. 2 (or FIG. 13). The reverse translation table is supplied to the coding rule restoring unit 55.

The coding rule restoring unit 55 restores (decodes) the embedded coded data supplied from the DEMUX 51 into the coded data encoded according to the true Huffman table constituting the coding rule, according to the reverse translation table supplied from the reverse translation table creation unit 54. Furthermore, the coding rule restoring unit 55 decodes the additional information embedded in the embedded coded data, based on the association between the embedded coded data and the restored coded data, that is, the reverse translation table. The coding rule restoring unit 55 outputs the restored coded data to the variable-length decoding unit 56 and also outputs the additional information that has been decoded as decoded additional information.

The variable-length decoding unit 56 creates a true Huffman table from the information related to Huffman table supplied from the DEMUX 51, and variable-length decodes the coded data supplied from the coding rule restoring unit 55 based on the true Huffman table, outputting the resulting decoded pixel values.

Figure 15:
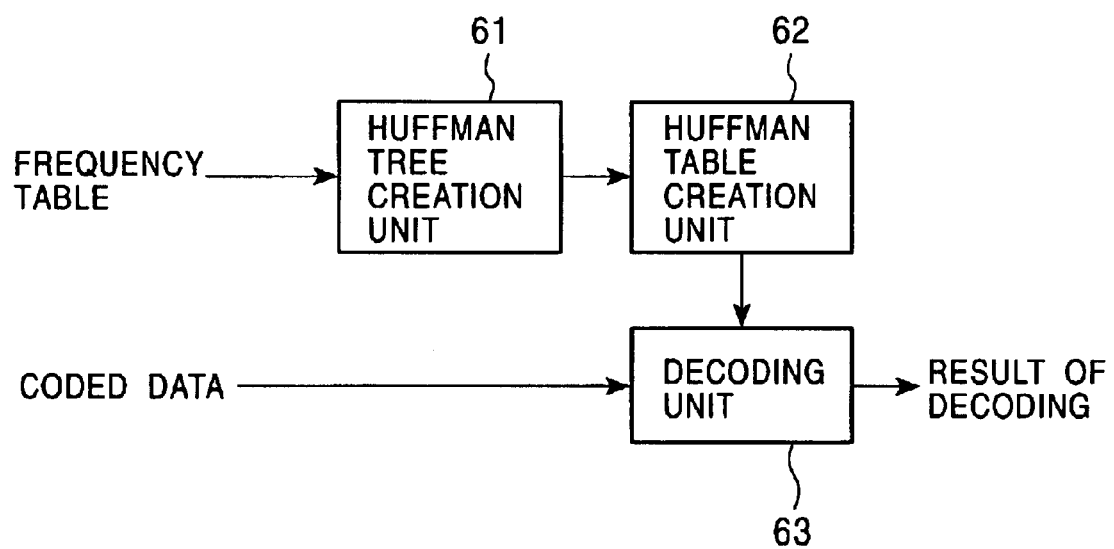
FIG. 15 is a block diagram showing an example construction of a variable-length decoding unit 52 and a variable-length decoding unit 56.

FIG. 15 shows an example construction of the variable-length decoding unit 52 shown in FIG. 14.

The embedded coded data output from the DEMUX 51 is supplied to a decoding unit 63, and the frequency table constituting the information related to Huffman table, output from the DEMUX 51, is supplied to a Huffman tree creation unit 61.

The Huffman tree creation unit 61 creates a Huffman tree from the frequency table associated with the frame under consideration, and supplies it to a Huffman table creation unit 62, similarly to the Huffman tree creation unit 32 shown in FIG. 3.

The Huffman table creation unit 62 creates a Huffman table based on the Huffman tree supplied from the Huffman tree creation unit 61, and supplies it to the decoding unit 63, similarly to the Huffman table creation unit 33 shown in FIG. 3.

The decoding unit 63 decodes the embedded coded data supplied thereto into pixel values (embedded decoded pixel values) according to the Huffman table supplied from the Huffman table creation unit 62, and outputs the result.

The variable-length decoding unit 56 shown in FIG. 14 is constructed the same as the variable-length decoding unit 52 shown in FIG. 15.

Figure 16:
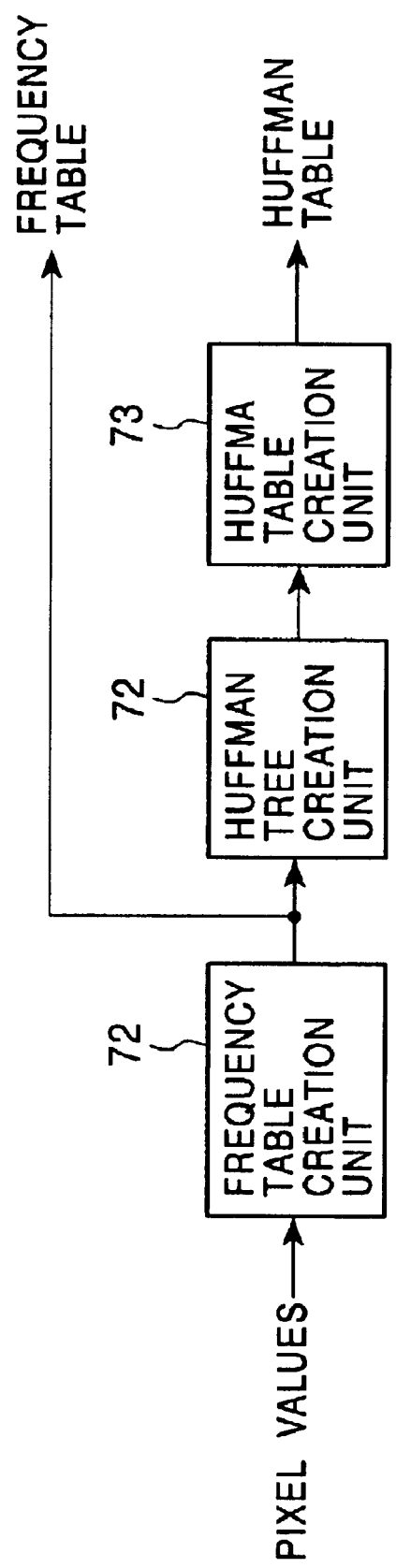
FIG. 16 is a block diagram showing an example construction of a Huffman table creation unit 53.

FIG. 16 shows an example construction of the Huffman table creation unit 53 shown in FIG. 14.

In the Huffman table creation unit 53, the embedded decoded pixel values output from the variable-length decoding unit 52 are supplied to a frequency table 71. The frequency table 71, a Huffman tree creation unit 72, and a Huffman table creation unit 73 executes similar processes as the frequency table creation unit 31, the Huffman tree creation unit 32, and the Huffman table creation unit 33 shown in FIG. 3, respectively.

Thus, the frequency table creation unit 71 creates a false frequency table, that is, a frequency table for the embedded decoded pixel values of the frame under consideration (not a frequency table for the original pixel values), which is supplied to the reverse translation table creation unit 54 (FIG. 14). The Huffman table creation unit 73 creates a false Huffman table, that is, a Huffman table for translating the embedded decoded pixel values of the frame under consideration into codes having code lengths in accordance with the frequencies of occurrence thereof (not a Huffman table for the original pixel values), which is supplied to the reverse translation table creation unit 54.

Figure 17:
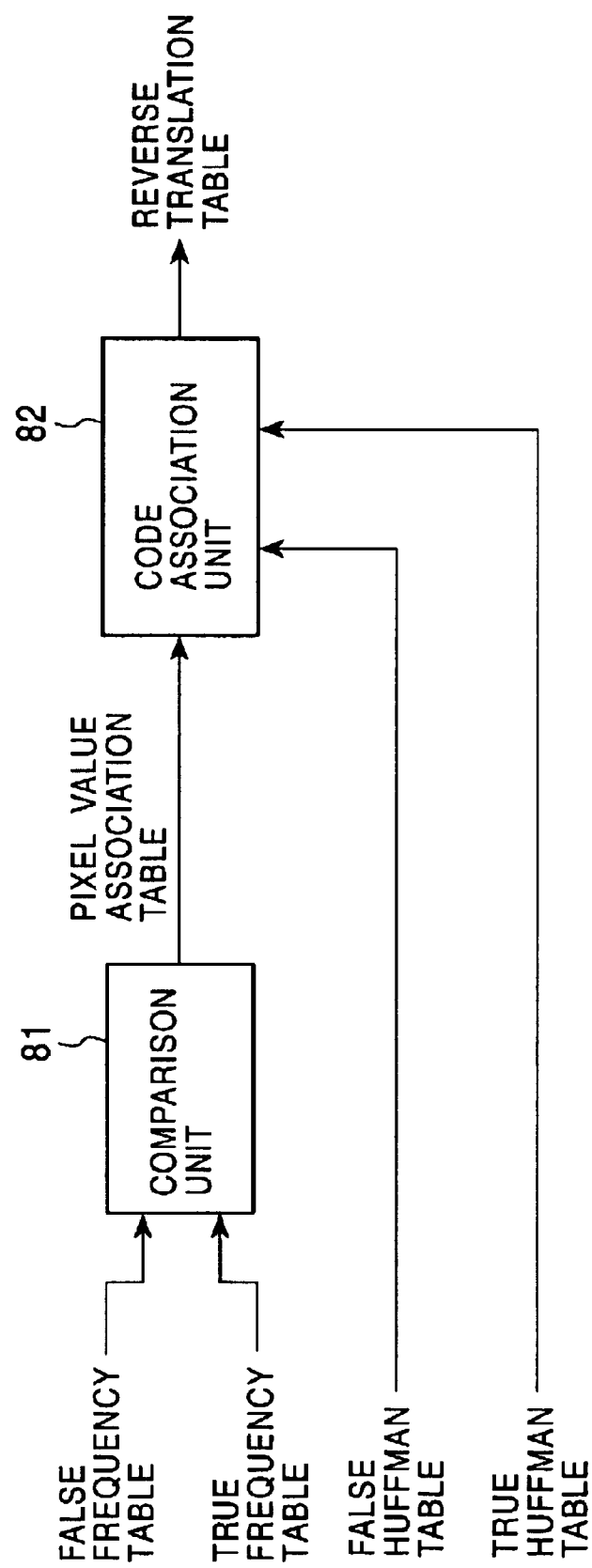
FIG. 17 is a block diagram showing an example construction of a reverse translation table creation unit 54.

FIG. 17 shows an example construction of the reverse translation table creation unit 54 shown in FIG. 14.

As described above, to the reverse translation table creation unit 54, the true Huffman table, the true frequency table, the false Huffman table, and the false frequency table are supplied. Based on these tables, the reverse translation table creation unit 54 recognizes the association between the embedded coded data and coded data encoded according to the true Huffman table, and creates a reverse translation table defining the association, as described with reference to FIGS. 6 to 9.

The true Huffman table and the false Huffman table are supplied to a code association unit 82, while the true frequency table and the false frequency table are supplied to a comparison unit 81.

The comparison unit 81 compares the true frequency table with the false frequency table to detect, for each code length, pixel values of the same frequency of occurrence in the true frequency table and the false frequency table. Furthermore, the comparison unit 81 creates a pixel value association table in which the pixel values of the same frequency in the true frequency table and the false frequency table are associated with each other, and supplies it to the code association unit 82.

The code association unit 82 searches the true Huffman table and the false Huffman table for the pixel values associated with each other in the pixel value association table supplied from the comparison unit 81, and associates codes respectively associated with the pixel values with each other, thereby creating a reverse translation table. The reverse translation table is supplied to the coding rule restoring unit 55.

Figure 18:
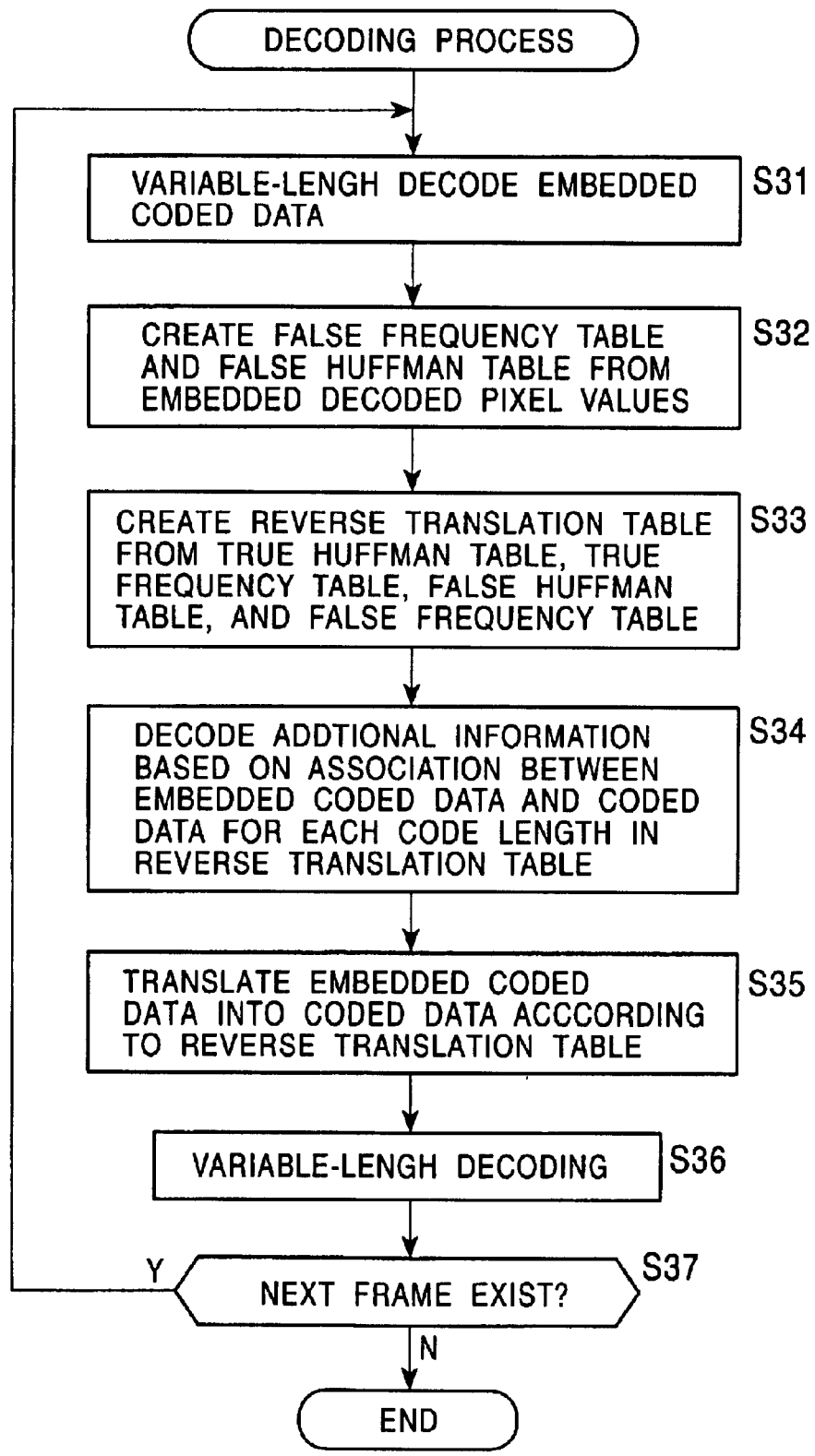
FIG. 18 is a flowchart showing a decoding process.

Now, a decoding process executed by the decoder 12 shown in FIG. 14 will be described with reference to a flowchart shown in FIG. 18.

The DEMUX 51 demultiplexes data supplied thereto into embedded coded data and information related to Huffman table, supplying the embedded coded data for each frame to the variable-length decoding unit 52 and to the coding rule restoring unit 55 while supplying the information related to Huffman table to the variable-length decoding unit 52, the reverse translation table creation unit 54, and to the variable-length decoding unit 56.

In step S31, the variable-length decoding unit 52 sequentially considers each frame of the embedded coded data and the information related to Huffman table output from the DEMUX 51, and variable-length decodes the embedded coded data of the frame under consideration.

More specifically, the variable-length decoding unit 52 creates a Huffman table (true Huffman table) from a frequency table (true frequency table) constituting the information related to Huffman table of the frame under consideration, and supplies it to the reverse translation table creation unit 54. Furthermore, the variable-length decoding unit 52 variable-length decodes the embedded coded data of the frame under consideration according to the true Huffman table, and supplies the resulting embedded decoded pixel values to the Huffman table creation unit 53.

The process then proceeds to step S32, in which the Huffman table creation unit 53 creates a frequency table (false frequency table) from the embedded decoded pixel values of the frame under consideration, supplied from the variable-length decoding unit 52, and further creates a false Huffman table from the false frequency table. The false frequency table and the false Huffman table are supplied to the reverse translation table creation unit 54.

In step S33, the reverse translation table creation unit 54 creates a reverse translation table based on the true Huffman table, the true frequency table constituting the information related to Huffman table, the false Huffman table, and the false frequency table, as described with reference to FIG. 17, and supplies it to the coding rule restoring unit 55.

In step S34, the coding rule restoring unit 55 decodes the additional information embedded in the embedded coded data, by referencing the association between the embedded coded data and coded data of each code length in the reverse translation table supplied from the reverse translation table creation unit 54, and outputs the resulting decoded additional information.

Furthermore, in step S35, the coding rule restoring unit 55 translates the embedded coded data supplied from the DEMUX 51 into coded data by referencing the reverse translation table, and supplies it to the variable-length decoding unit 56.

The variable-length decoding unit 56 creates a true Huffman table from the information related to Huffman table supplied from the DEMUX 51, and variable-length decodes the coded data supplied from the coding rule restoring unit 55 based on the true Huffman table, outputting the resulting decoded pixel values.

The process then proceeds to step S37, in which it is determined whether embedded coded data and information related to Huffman table for a next frame has been output from the DEMUX 51. If it is determined that they have been output, with the next frame a new frame to be considered, the process returns to step S31, repeating the same process.

If it is determined in step S37 that embedded coded data and information related to Huffman table for a next frame have not been output from the DEMUX 51, the decoding process is exited.

As described earlier, instead of the frequency table, the Huffman table itself may be used as the information related to Huffman table. In that case, however, the Huffman table constituting the information related to Huffman table must be created such that the frequencies of occurrence of pixel values to which codes (coded data) of the same length are assigned can be recognized as being higher or lower relative to each other by referencing the Huffman table (according to a rule that allows such recognition).

Furthermore, although Huffman tables are created on a frame basis in the example described above, alternatively, Huffman tables may be created, for example, on a field basis, or on a basis of two or more frames.

Furthermore, Huffman tables may be created in advance, for example, using a predetermined image data, so that the embedded compression encoder 11 and the decoder 12 execute processes according to the Huffman tables created in advance. In that case, however, if Huffman tables created from image data to be processed do not coincide with the Huffman tables created from the predetermined image data, the decoder 12 will not be able to restore embedded coded data into coded data. Thus, additional information to be embedded must be limited only to such image data from which the same Huffman tables as those created from the predetermined image data can be obtained.

Figure 19:
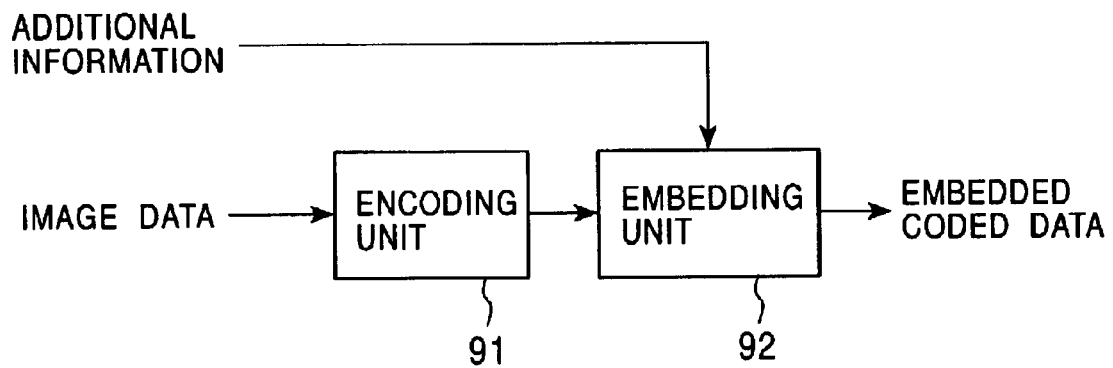
FIG. 19 is a block diagram showing a third example construction of the embedded compression encoder 11.

FIG. 19 shows another example construction of the embedded compression encoder 11 shown in FIG. 1.

To an encoding unit 91, image data to be encoded is supplied. The encoding unit 91 encodes the image data according to a predetermined coding rule, outputting the resulting coded data to an embedding unit 92.

To the embedding unit 92, additional information is supplied. The embedding unit 92 manipulates the coded data supplied from the encoding unit 91 based on the additional information to obtain coded data encoded according to a destroyed coding rule, thereby embedding the additional information in the coded data.

Figure 20:
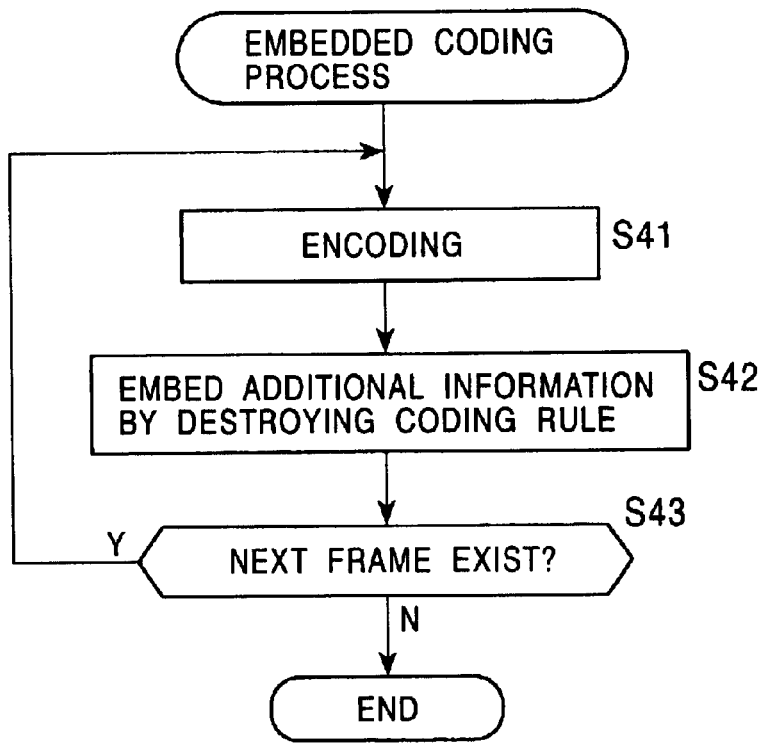
FIG. 20 is a flowchart showing an embedded coding process.

Now, a process executed by the embedded compression encoder 11 shown in FIG. 19 (embedded coding process) will be described with reference to a flowchart shown in FIG. 20.

To the encoding unit 91, image data to be encoded is supplied, for example, on a frame basis. The encoding unit 91 sequentially considers each frame, and in step S41, it encodes image data of the frame under consideration according to a predetermined coding rule. The encoding unit 91 then outputs the resulting coded data to the embedding unit 92.

In step S42, the embedding unit 92 modifies or destroys the coding rule in the encoding unit 91 based on the additional information, thereby embedding the additional information. That is, the embedding unit 92 manipulates the coded data supplied from the encoding unit 91 based on the additional information, thereby embedding the additional information in the coded data. Furthermore, the embedding unit outputs embedded coded data obtained by embedding the additional information in the coded data. The process then proceeds to step S43.

In step S43, the encoding unit 91 determines whether a next frame to be encoded exists. If it is determined that a next frame exists, with the next frame as a new frame to be considered, the process returns to step S41, repeating the same process.

If it is determined in step S43 that no further frame exists to be encoded next, the embedded coding process is exited.

Figure 21:
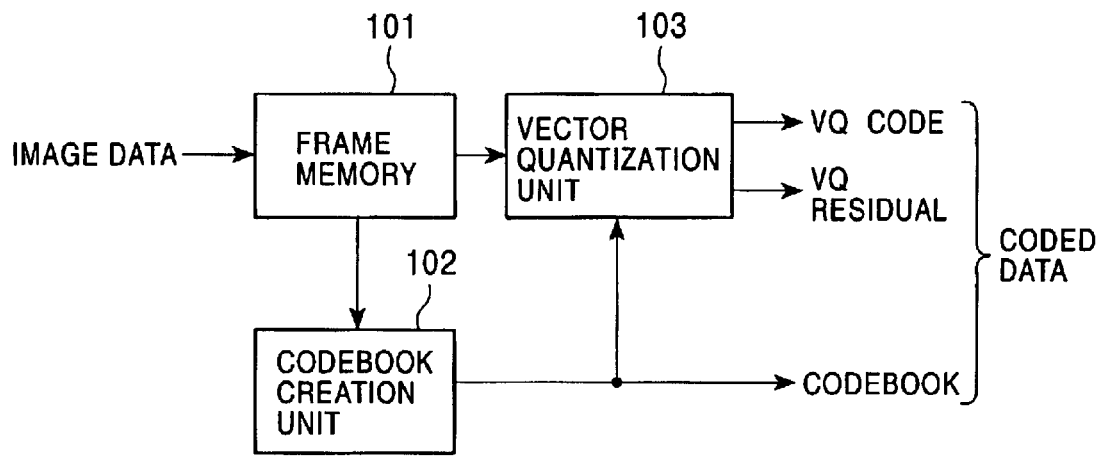
FIG. 21 is a block diagram showing an example construction of an encoding unit 91.

FIG. 21 shows an example construction of the encoding unit 91 shown in FIG. 19.

In the encoding unit 91 shown in FIG. 21, for example, if the pixel values constituting image data are represented in RGB (Red, Green, and Blue), each of the pixel values is vector-quantized in the RGB color space, and a code representing a centroid vector (hereinafter referred to as VQ code when appropriate), an error of the pixel value represented by the centroid vector corresponding to the code relative to the original pixel value (hereinafter referred to as VQ residual when appropriate), and a codebook used for the vector quantization are output as coded data.

More specifically, image data to be encoded is supplied to a frame memory 101, and the frame memory 101 sequentially stores image data supplied thereto, for example, on a frame basis.

A codebook creation unit 102 sequentially considers each frame of the image data stored in the frame memory 101, and creates a codebook to be used for vector quantization in the color space from the pixel value of each of the pixels constituting the frame under consideration, for example, by what is called the LBG algorithm. The codebook is supplied to a vector quantization unit 103, and is output as (part of) coded data.

The vector quantization unit 103 reads the frame under consideration from the frame memory 101, and sequentially considers each of the pixels constituting the frame under consideration, for example, in order of raster scanning. The vector quantization unit 103 vector-quantizes the pixel value of the pixel under consideration using the codebook supplied from the codebook creation unit 102, outputting the resulting VQ code and VQ residual as (part of) coded data.

Figure 22:
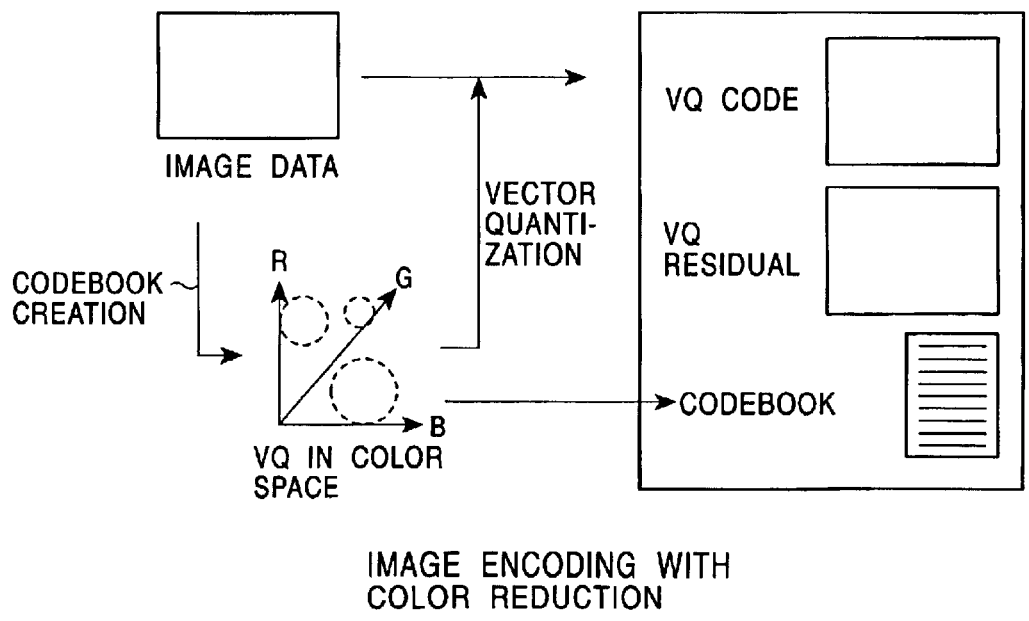
FIG. 22 is a diagram showing encoding by vector quantization.

As shown in FIG. 22, in the encoding unit 91 constructed as described above, the codebook creation unit 102 creates a codebook from the pixel value of each of the pixels constituting the frame under consideration, which is supplied to the vector quantization unit 103. The vector quantization unit 103 vector-quantizes the pixel value of a pixel under consideration using the codebook supplied from the codebook creation unit 102.

That is, the vector quantization unit 103 detects, from the codebook, a centroid vector representing a point with the shortest distance to the point on the RGB space represented by the pixel value of the pixel under consideration, outputting a VQ code representing the centroid vector. Furthermore, the vector quantization unit 103 calculates the difference between the centroid vector represented by the VQ code and the vector corresponding to the point on the RGB space represented by the pixel value of the pixel under consideration, outputting the resulting difference vector as VQ residual.

The encoding unit 91 then outputs the codebook, and the VQ code and VQ residual for each of the pixels in the frame under consideration, thus obtained, as coded data associated with the frame under consideration.

Figure 23:
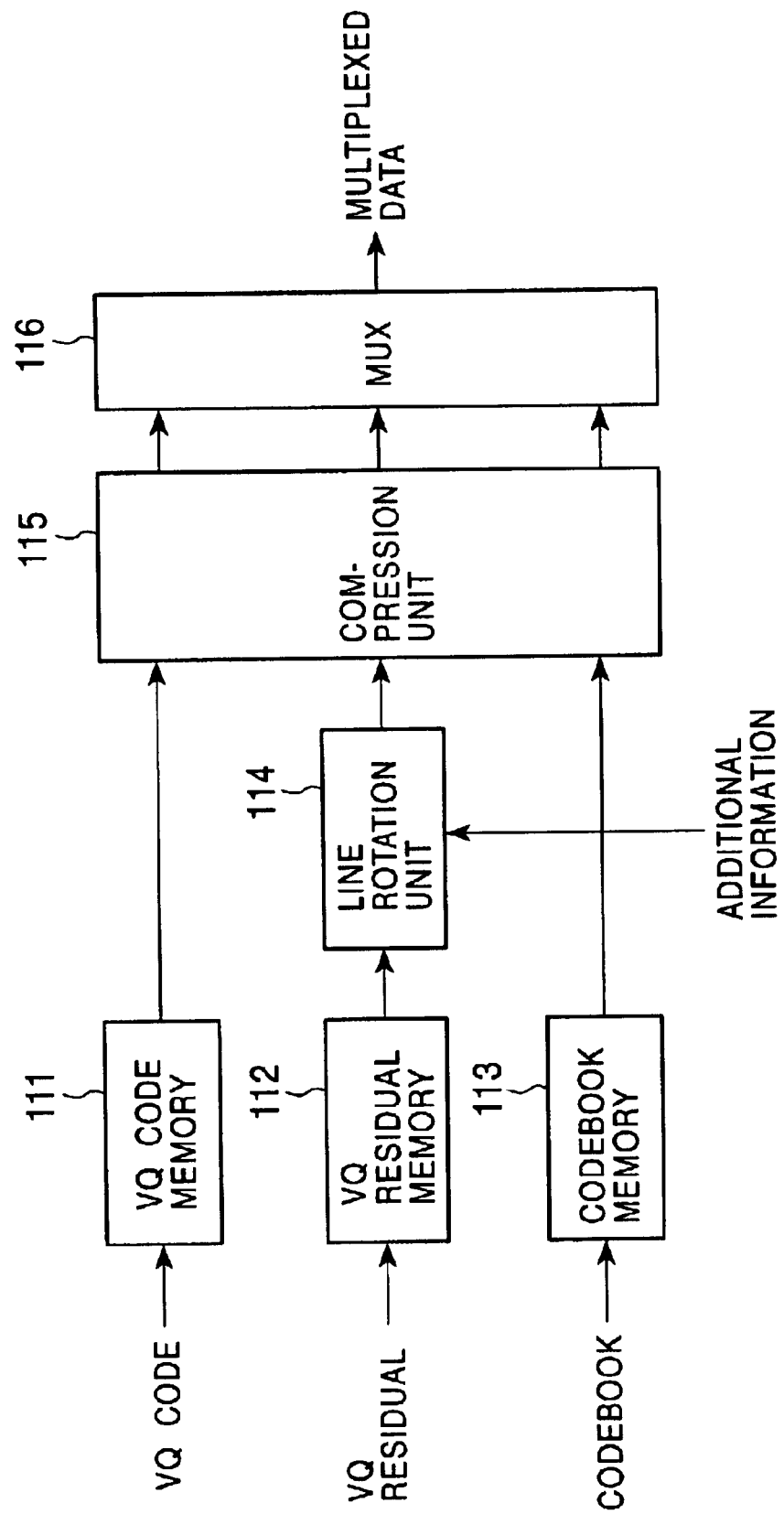
FIG. 23 is a block diagram showing an example construction of an embedding unit 92.

FIG. 23 shows an example construction of the embedding unit 92 shown in FIG. 19, in a case where the encoding unit 91 is constructed as shown in FIG. 21.

The VQ code, VQ residual, and the codebook of the frame under consideration, output from the encoding unit 91, are supplied to and stored in a VQ code memory 111, a VQ residual memory 112, and a codebook memory 113, respectively.

The VQ code and the codebook stored respectively in the VQ code memory 111 and the codebook memory 113 are read therefrom, and supplied to a compression unit 115.

Figure 24:
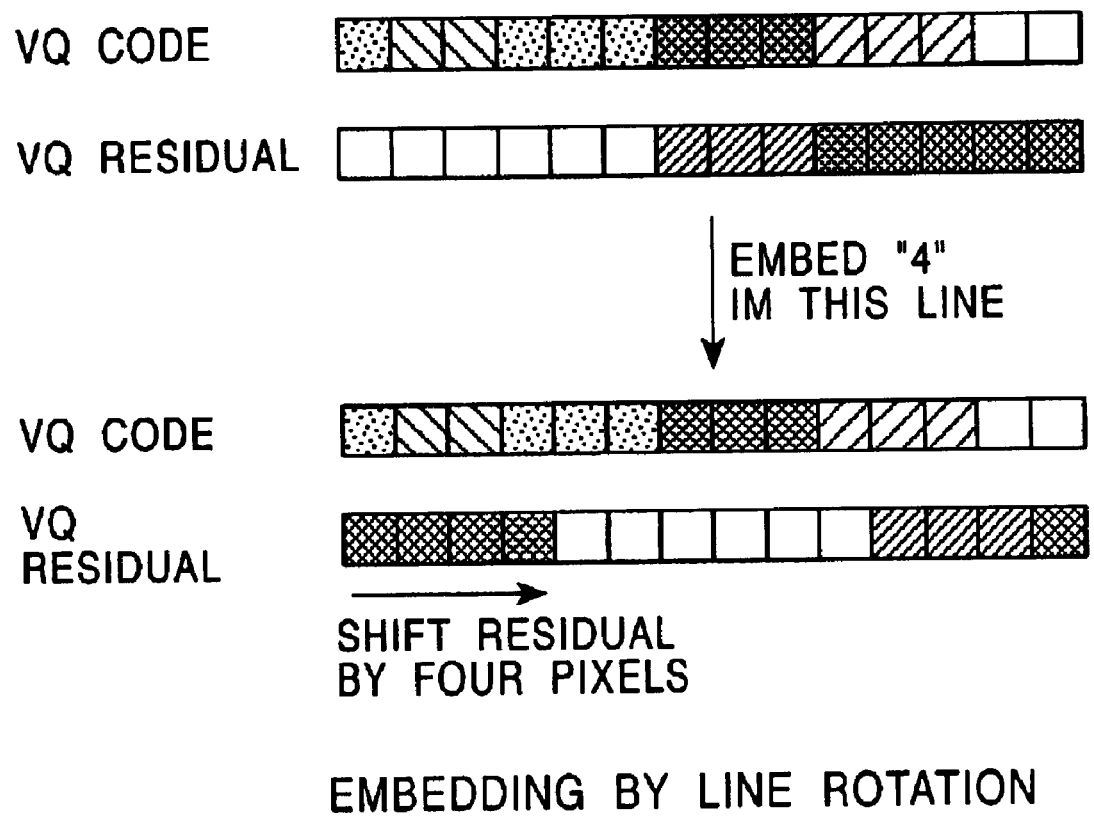
FIG. 24 is a diagram showing embedding of additional information by line rotation.

A line rotation unit 114 sequentially considers each line in the frame under consideration, for example, from top to bottom, and reads the VQ residual of the line under consideration stored in the VQ residual memory 112. Furthermore, letting the number of pixels constituting the line under consideration be denoted by x, the line rotation unit 114 receives additional information of the number of bits represented by int[$\log_2 x$], and, for example, as shown in FIG. 24, rotates the VQ residual of the line under consideration to the right for the number of bits corresponding to the additional information, thereby embedding the additional information in the line under consideration. That is, with regard to a pixel on the line under consideration, the line rotation basically changes the VQ residual for the pixel from that obtained by the vector quantization, that is, the coding rule for the vector quantization is modified or destroyed. By destroying the coding rule, the additional information is embedded.

Then, the line rotation unit 114 supplies the VQ residual of the line under consideration with the additional information embedded therein to the compression unit 115.

The compression unit 115 compresses the VQ code, VQ residual, and codebook supplied thereto, for example, based on spatial correlation or bias of entropy, and outputs the results of the compression to a MUX 116. The MUX 116 multiplexes the compressed VQ code, VQ residual, and codebook for output.

Figure 25:
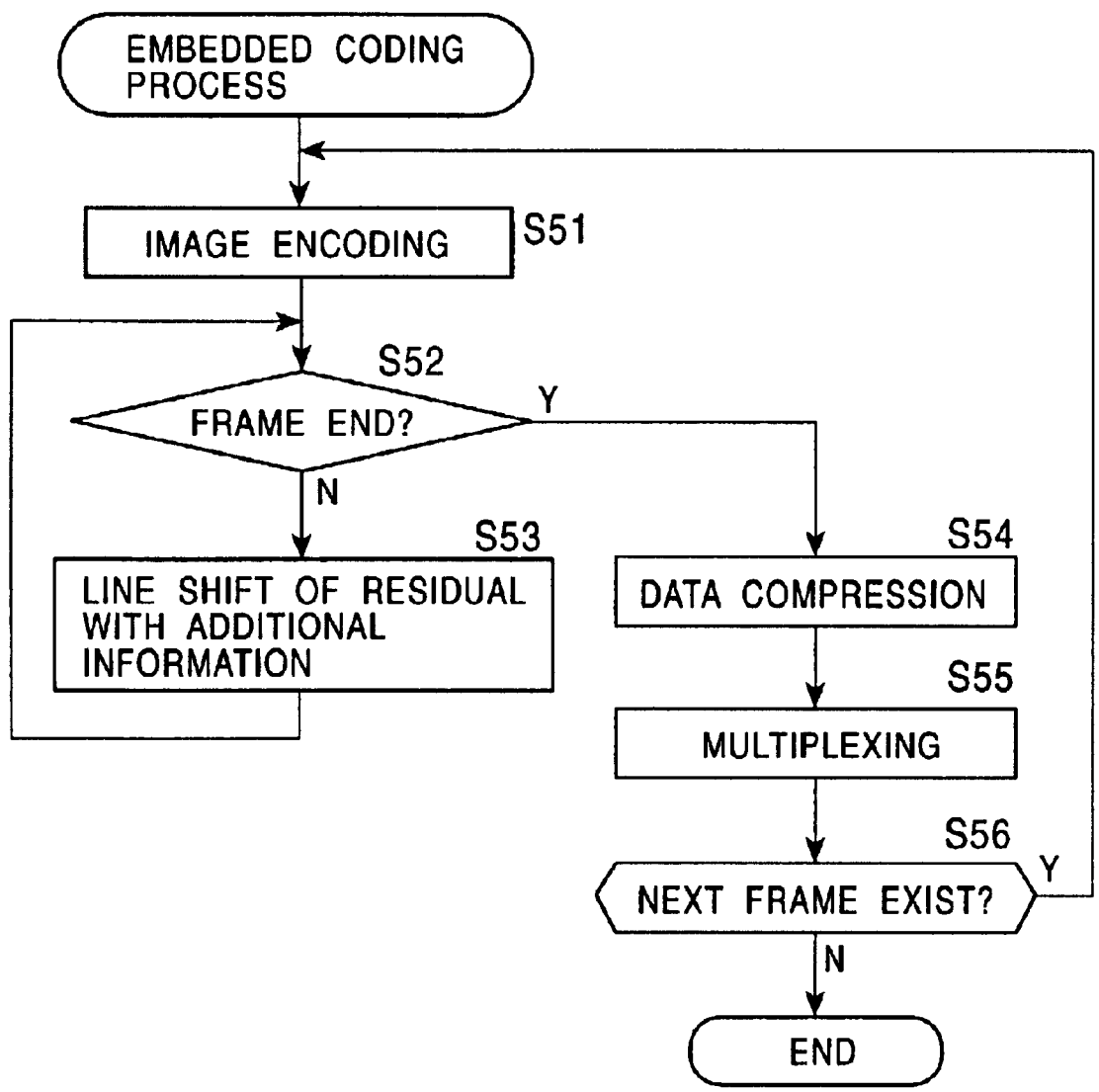
FIG. 25 is a flowchart showing an embedded coding process.

Now, a process executed by the embedded compression encoder 11 shown in FIG. 19 (embedded coding process), in a case where the encoding unit 91 is constructed as shown in FIG. 21 and the embedding unit 92 is constructed as shown in FIG. 23, will be described with reference to a flowchart shown in FIG. 25.

In the encoding unit 91 (FIG. 21), a predetermined frame stored in the frame memory 101 is considered, and in step S51, each pixel in the frame under consideration is encoded by vector quantization, as described earlier. The VQ code, VQ residual, and codebook, constituting the coded data obtained by vector-quantizing the frame under consideration, are supplied to the embedding unit 92.

In the embedding unit 92 (FIG. 23), the VQ code, VQ residual, and codebook associated with the frame under consideration, supplied from the encoding unit 91, are supplied to and stored in the VQ code memory 111, the VQ residual memory 112, and the codebook memory 113, respectively. In step S52, the line rotation unit 114 determines whether all the lines of the frame under consideration for which a VQ residual is stored in the VQ residual memory 112 have been processed.

If it is determined in step S52 that all the lines of the frame under consideration for which a VQ residual is stored in the VQ residual memory 112 have not been processed yet, the line rotation unit 114 selects the uppermost one of the lines yet to be processed in the frame under consideration as a new line to be considered. The process then proceeds to step S53.

In step S53, the line rotation unit 114 rotates each of the pixels in the line under consideration, having VQ residuals as pixel values, to the right for the number of pixels corresponding to the additional information, thereby embedding the additional information in the line under consideration, and supplies the result to the compression unit 115. The process then returns to step S52, repeating the same process.

If it is determined in step S52 that all the lines of the frame under consideration for which a residual is stored in the VQ residual memory 112 have been processed, the process proceeds to step S54, in which the compression unit 115 reads the VQ code of the frame under consideration stored in the VQ code memory 111, and also reads the codebook for the frame under consideration stored in the codebook memory 113. In step S54, the compression unit 115 compresses the VQ code and the codebook, and the VQ residual with the additional information embedded therein, supplied from the line rotation unit 114, and supplies the results to the MUX 116.

In step S55, the MUX 116 multiplexes the VQ code, VQ residual, and codebook supplied from the compression unit 115 for output. The process then proceeds to step S56.

In step S56, it is determined whether a next frame to be encoded in the encoding unit 91 exists. If it is determined that a next frame exists, with the next frame to be encoded as a new frame to be considered, the process returns to step S51, repeating the same process.

If it is determined in step S56 that no further frame exists to be encoded next, the embedded coding process is exited.

Figure 26:
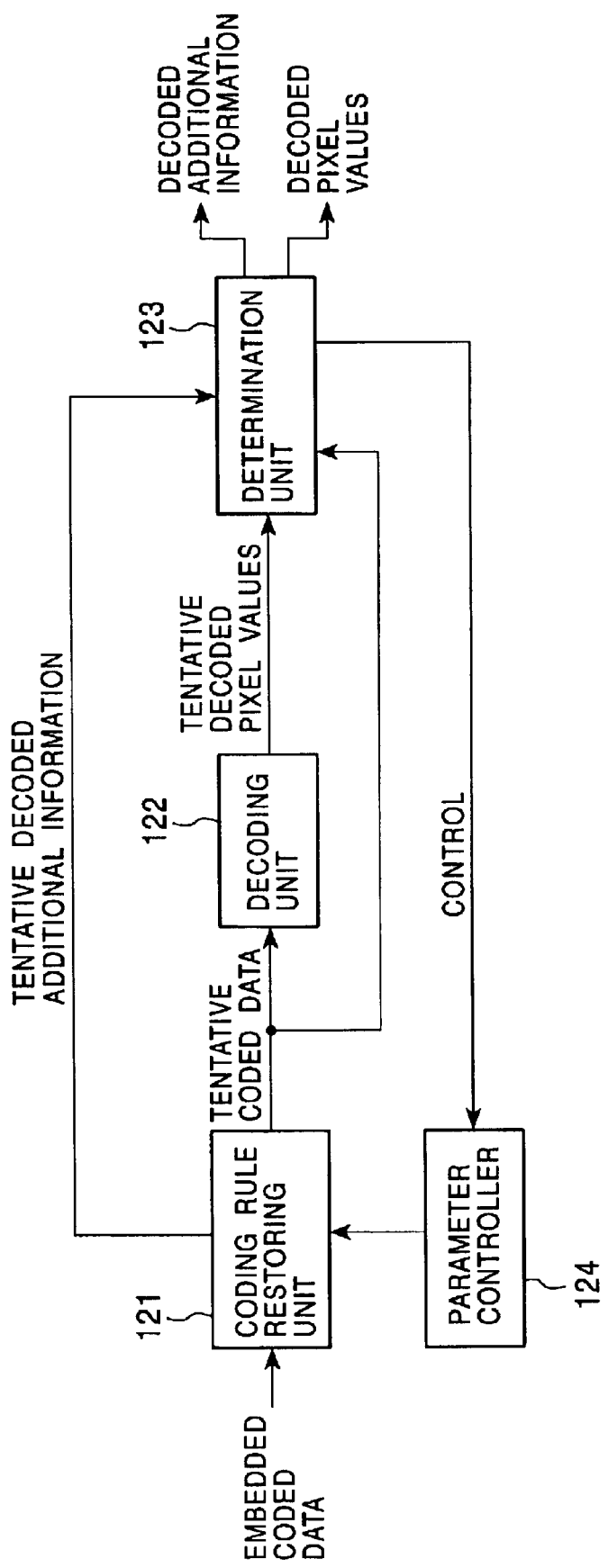
FIG. 26 is a block diagram showing a second example construction of the decoder 12.

FIG. 26 shows an example construction of the decoder 12 shown in FIG. 1, in a case where the embedded compression encoder 11 is constructed as shown in FIG. 19.

The embedded coded data output from the embedding unit 92 shown in FIG. 19 is supplied to a coding rule restoring unit 121.

The coding rule restoring unit 121 restores (decodes) the embedded coded data into the coded data encoded according to the coding rule in the encoding unit 91 shown in FIG. 19, thereby decoding the additional information embedded in the embedded coded data.

That is, the coding rule restoring unit 121 manipulates the embedded coded data based on a parameter supplied from a parameter controller 124, thereby obtaining a candidate of the coded data (hereinafter referred to as tentative coded data when appropriate). Furthermore, the coding rule restoring unit 121 obtains a candidate of the additional information (hereinafter referred to as tentative decoded additional information) embedded in the embedded coded data, based on an operation for restoring the embedded coded data into the tentative coded data. The tentative coded data is supplied to a decoding unit 122 and to a determination unit 123, while the tentative decoded additional information is supplied to the determination unit 123.

The decoding unit 122 performs a decoding operation upon the tentative coded data supplied from the coding rule restoring unit 121, based on the coding rule in the encoding unit 91 shown in FIG. 19, thereby obtaining a candidate of the original pixel value (hereinafter referred to as tentative decoded pixel value when appropriate). The tentative decoded pixel value is supplied to the determination unit 123.

The determination unit 123 controls the parameter controller 124 to supply one or more parameter values to the coding rule restoring unit 121, and determines a correct tentative decoded pixel value (coinciding with the original pixel value) from one or more the tentative decoded pixel values obtained respectively in accordance with the one or more parameter values. Furthermore, the determination unit 123 selects, from one or more tentative decoded additional information supplied from the coding rule restoring unit 121 respectively in association with the one or more tentative decoded pixel values, the tentative decoded additional information associated with the correct decoded pixel value as correct decoded additional information, outputting the correct decoded pixel value and the tentative decoded additional information as the final results of decoding of pixel value and additional information (decoded pixel value and decoded additional information), respectively.

The parameter controller 124, under the control of the determination unit 123, supplies a parameter for manipulating the embedded coded data to the coding rule restoring unit 121.

Figure 27:
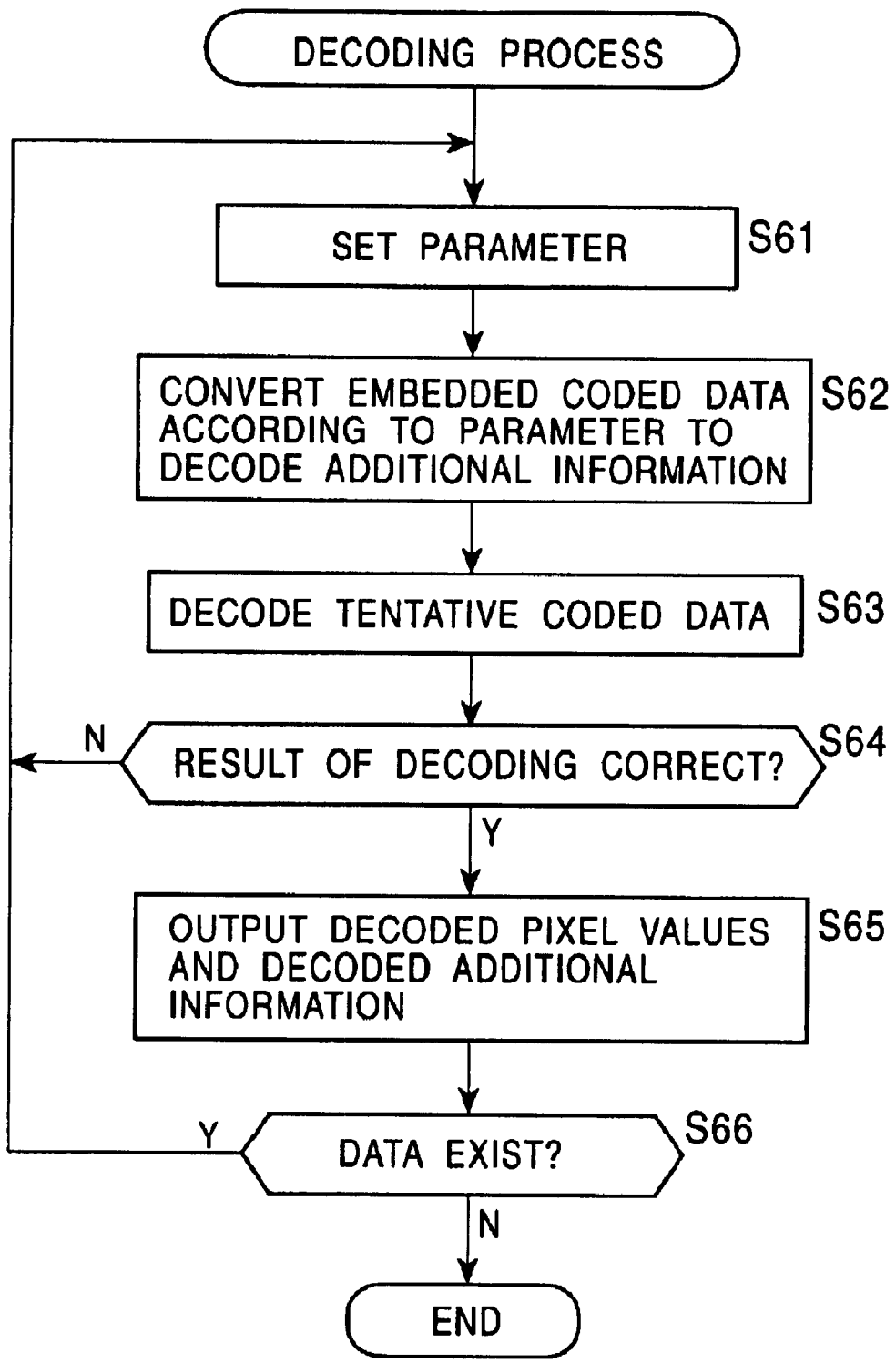
FIG. 27 is a flowchart showing a decoding process.

Now, a process executed by the decoder 12 shown in FIG. 26 (decoding process) will be described with reference to a flowchart shown in FIG. 27.

Initially, in step S61, the determination unit 123 controls the parameter controller 124 to set a parameter to be supplied to the coding rule restoring unit 121. Accordingly, the parameter controller 126 supplies a parameter, in accordance with the control by the determination unit 123, to the coding rule restoring unit 121.

In step S62, the coding rule restoring unit 121 manipulates the embedded coded data based on the parameter supplied from the parameter controller 124, translating it into the tentative coded data, and supplies the tentative coded data to the decoding unit 122 and to the determination unit 123. Furthermore, the coding rule restoring unit 121, based on the operation for restoring the embedded coded data into tentative coded data, that is, the parameter supplied from the parameter controller 124, decodes the additional information embedded in the embedded coded, and supplies the result to the determination unit 123 as tentative decoded additional information.

In step S63, the decoding unit 122 decodes the tentative coded data supplied from the coding rule restoring unit 121 based on the coding rule in the encoding unit 91 shown in FIG. 19, and supplies the resulting pixel value to the determination unit 123 as tentative decoded pixel value.

In step S64, the determination unit 123 determines whether the tentative decoded pixel value supplied from the decoding unit 122 is a correct decoding result (coinciding with the original pixel value). If it is determined as not coinciding, the process returns to step S61. In this case, in step S61, the determination unit 123 sets a new value as a parameter to be output from the parameter controller 124, and the same process is repeated.

If it is determined in step S64 that the tentative decoded pixel value is a correct decoding result, the process proceeds to step S65, in which the determination unit 123 outputs the tentative decoded pixel value as decoded pixel value constituting the result of decoding of the original pixel value. Furthermore, the determination unit 123 outputs the tentative decoded additional information associated with the decoded pixel value, as decoded additional information constituting the result of decoding of the additional information embedded. The process then proceeds to step S66.

In step S66, it is determined whether further embedded coded data to be decoded is remaining. If it is determined as remaining, the process returns to step S61, repeating the same process for the embedded coded data to be decoded.

If it is determined in step S66 that further embedded coded data to be decoded does not exist, the decoding process is exited.

Figure 28:
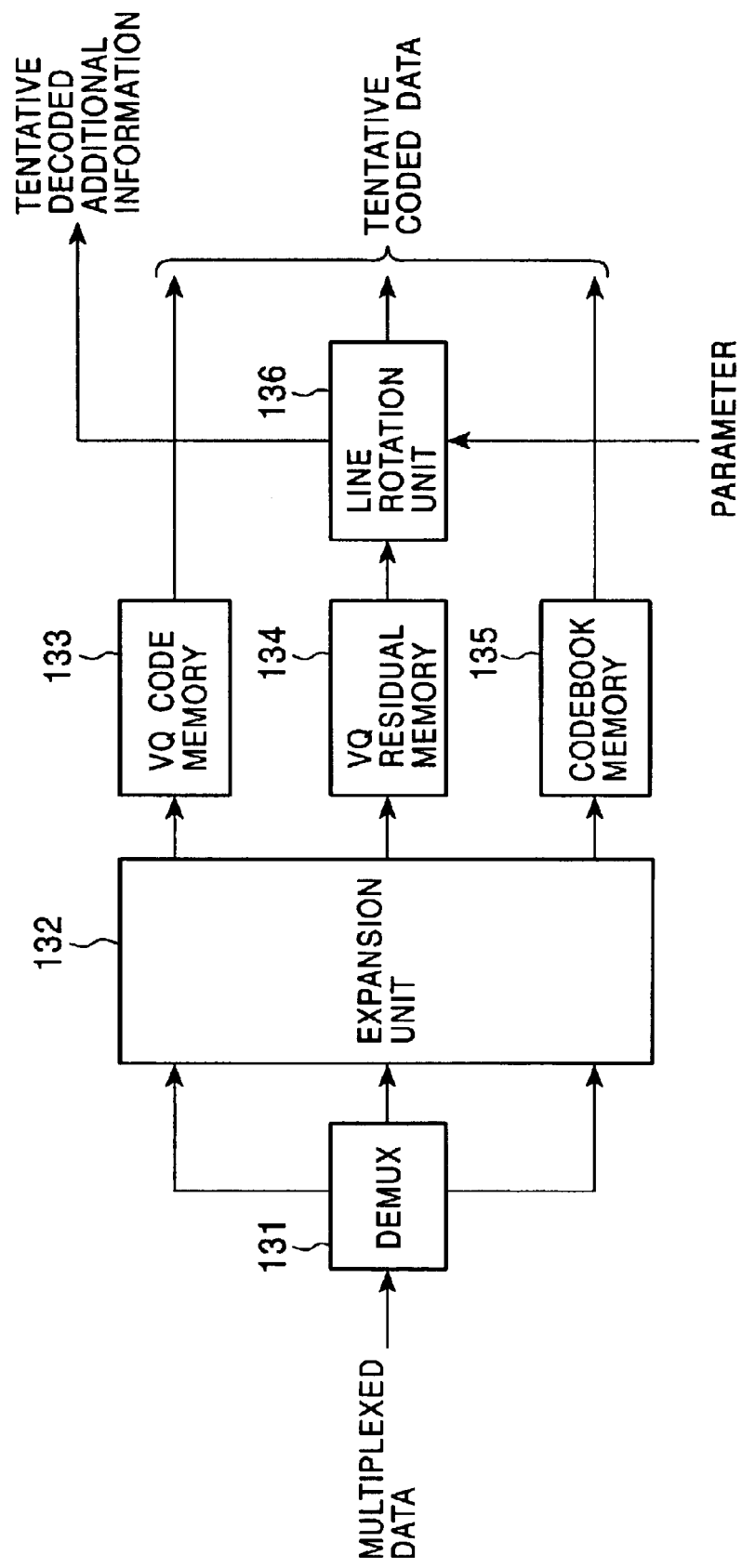
FIG. 28 is a block diagram showing an example construction of a coding rule restoring unit 121.

FIG. 28 shows an example construction of the coding rule restoring unit 121 shown in FIG. 26, in a case where the embedding unit 92 shown in FIG. 19 is constructed as shown in FIG. 23.

Data output from the MUX 116 shown in FIG. 23 is supplied to a DEMUX 131. The DEMUX 131 demultiplexes the data supplied thereto into compressed VQ code, VQ residual, and codebook, and supplies them to an expansion unit 132. The expansion unit 132 expands the compressed VQ code, VQ residual, and codebook supplied from the DEMUX 131, and supplies the expanded VQ code, VQ residual, and codebook to a VQ code memory 133, a VQ residual memory 134, and to a codebook memory 135, respectively.

The VQ code memory 133, the VQ residual memory 134, and the codebook memory 135 store, on a frame basis, the VQ code, VQ residual, and codebook supplied from the expansion unit 132, respectively.

A line rotation unit 136 sequentially considers each line of the frame stored in the VQ residual memory 134, for example, from top to bottom, and reads the VQ residual of the line under consideration stored in the VQ residual memory 134. Furthermore, letting the number of pixels constituting the line under consideration be denoted by x, the line rotation unit 136 receives an integer in a range of zero to x as a parameter from the parameter controller 124 (FIG. 26), and rotates the VQ residual of the line under consideration to the left for the number of pixels corresponding to the parameter. The line rotation unit 136 outputs the VQ residual of each line after the rotation as tentative coded data, together with the VQ code stored in the VQ code memory 133 and the codebook stored in the codebook memory 135.

Furthermore, the line rotation unit 136 outputs the parameter value supplied from the parameter controller 124 as tentative decoded additional information.

Figure 29:
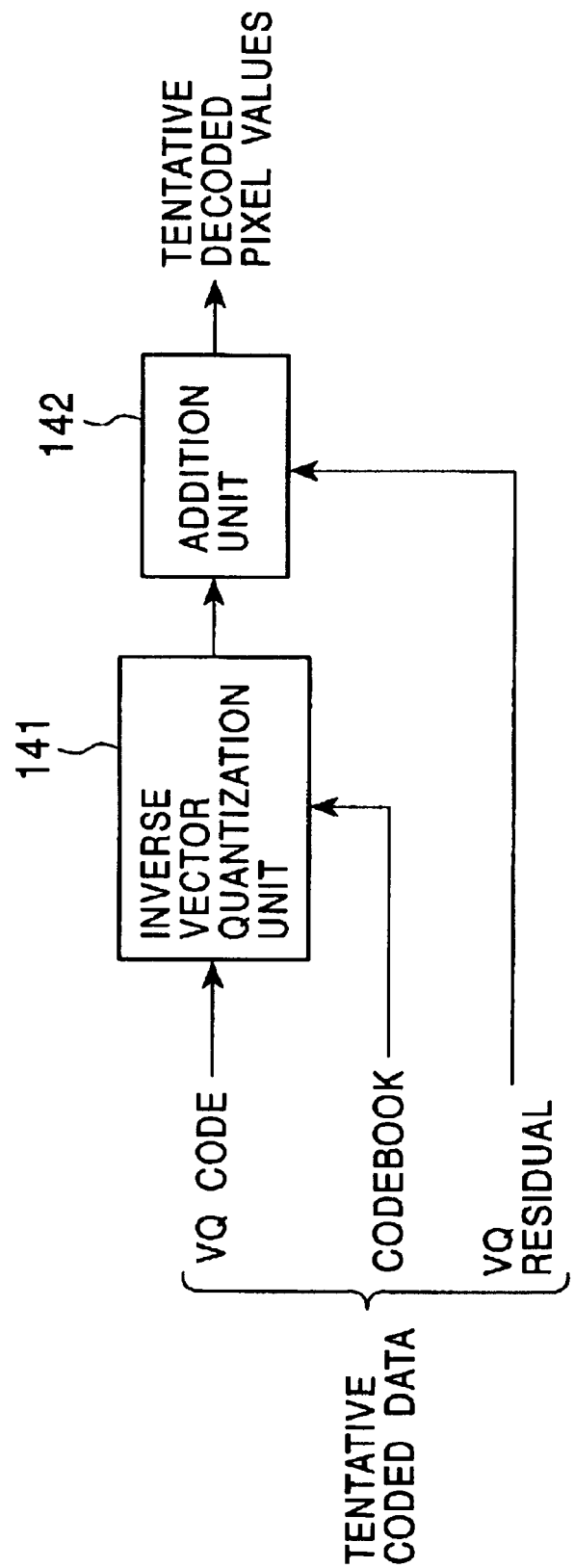
FIG. 29 is a block diagram showing an example construction of a decoding unit 122.

FIG. 29 shows an example construction of the decoding unit 122 shown in FIG. 26, in a case where the encoding unit 91 shown in FIG. 19 is constructed as shown in FIG. 21.

The decoding unit 122 decodes pixel values by inverse vector quantization based on the VQ code, VQ residual, and codebook of a frame, constituting the coded data supplied from the coding rule restoring unit 121.

That is, to an inverse vector quantization unit 141, the VQ code and codebook are supplied. The inverse vector quantization unit 141 detects a centroid vector corresponding to the VQ code from the codebook, and supplies the centroid vector to an addition unit 142. To the addition unit 142, as well as the centroid vector supplied from the inverse vector quantization unit 141, a difference vector constituting the VQ residual is also supplied. The addition unit 142 adds the centroid vector and the difference vector. The addition unit 142 outputs pixel values having the components of the vector obtained by the addition as the R, G, and B values as tentative decoded pixel value.

Figure 30:
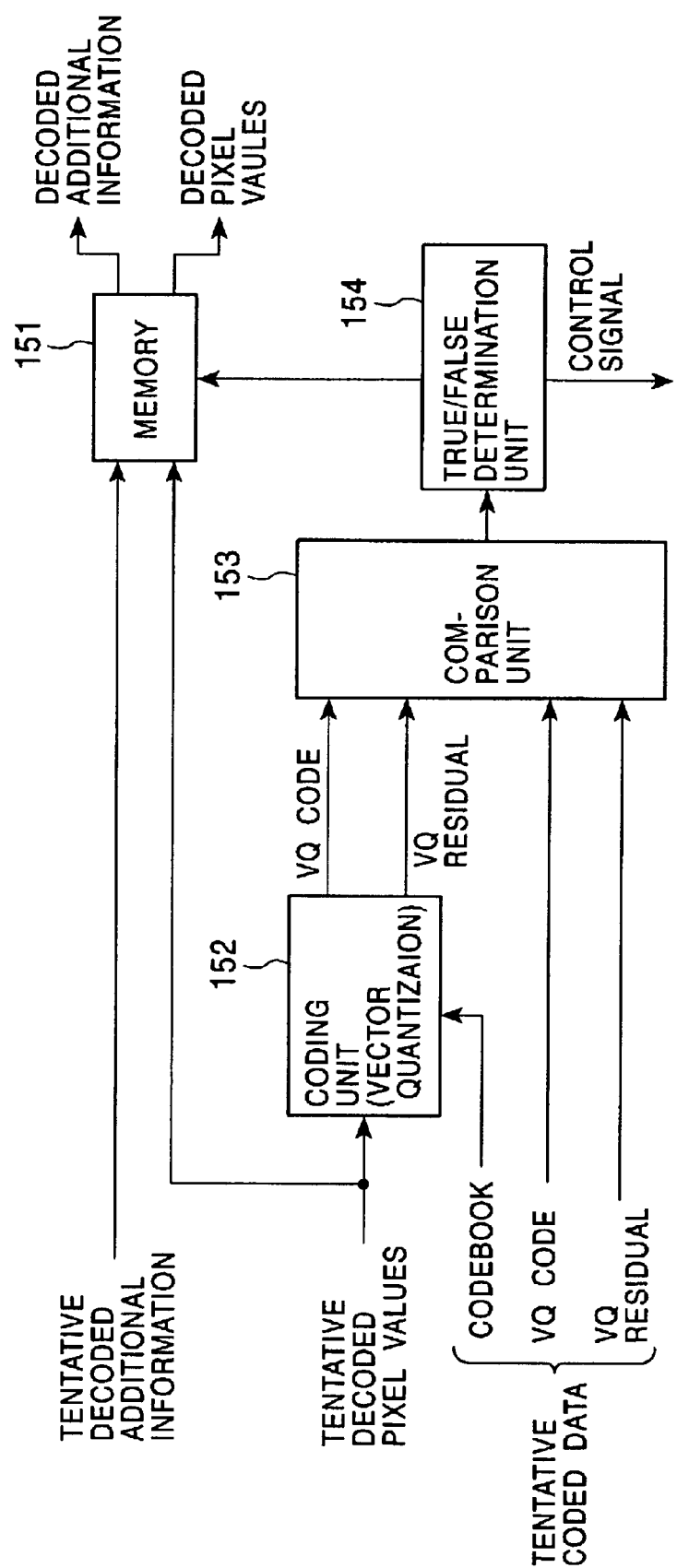
FIG. 30 is a block diagram showing an example construction of a determination unit 123.

FIG. 30 shows an example construction of the determination unit 123 shown in FIG. 26, in a case where the coding rule restoring unit 121 and the decoding unit 122 are constructed as shown in FIGS. 28 and 29, respectively.

To a memory 151, the tentative decoded additional information from the coding rule restoring unit 121 and the tentative decoded pixel value from the decoding unit 122 are supplied. The memory 151 temporarily stores the tentative decoded additional information and the tentative decoded pixel value, and reads the tentative decoded additional information and the tentative decoded pixel value under the control of a true/false determination unit 154, outputting them as decoded additional information and decoded pixel value, respectively.

To an encoding unit 152, the codebook included in the tentative coded data output from the coding rule restoring unit 121 and the tentative decoded pixel value output from the decoding unit 122 are supplied. The encoding unit 152 encodes the tentative decoded pixel value similarly to the encoding unit 91 shown in FIG. 19. That is, the encoding unit 152 vector-quantizes the tentative decoded pixel value using the codebook supplied from the coding rule restoring unit 121, supplying the resulting VQ code and VQ residual to a comparison unit 153. The VQ code and VQ residual obtained by vector-quantizing the tentative decoded pixel value will hereinafter be referred to, when appropriate, as tentative VQ code and tentative VQ residual, respectively.

To the comparison unit 153, as well as the tentative VQ code and tentative VQ residual output from the encoding unit 152, the VQ code and VQ residual included in the tentative coded data output from the coding rule restoring unit 121 are supplied. The comparison unit 153 compares the tentative VQ code with the VQ code in the tentative coded data, and also compares the tentative VQ residual with the VQ residual in the tentative coded data, supplying the results of the comparisons to the true/false determination unit 154.

The true/false determination unit 154 controls the parameter controller 124 to supply the number of bits for line rotation to the coding rule restoring unit 121 as a parameter. Furthermore, the true/false determination unit 154 determines whether the tentative decoded pixel value is a correct decoding result based on the result of the comparison of the tentative VQ code and the VQ code in the tentative coded data, and the result of the comparison of the tentative VQ residual and the VQ residual in the tentative coded data, supplied from the comparison unit 153, and controls reading of the tentative decoded pixel value and the tentative decoded additional information from the memory 151 based on the result of the determination.

Now, the principle of determination by the true/false determination unit 154 shown in FIG. 30 as to whether the tentative decoded pixel value is a correct decoding result will be described with reference to FIG. 31.

Since the encoding unit 91 (FIG. 19) performs vector quantization in the RGB space, a centroid vector used in the vector quantization is composed of three components, namely, R, B, and G components. Letting the centroid vector composed of the R, B, and G components be denoted as (R, G, B), and assuming that each of the R, B, and G components of the centroid vector in the codebook is represented by a multiple of ten for simplicity of description, for example, a pixel value with R, B, and G components of 102, 103, and 99, respectively, (hereinafter denoted as pixel value (102, 103, 99) when appropriate) has the shortest distance relative to a centroid vector (100, 100, 100), and thus is vector-quantized into a VQ code associated with the centroid vector (100, 100, 100). For example, let the VQ code associated with the centroid vector (100, 100, 100) be 0.

In this case, subtracting the centroid vector (100, 100, 100) from the pixel value (102, 103, 99) yields the VQ residual (2, 3, −1). Thus, the pixel value (102, 103, 99) is encoded into the VQ code 0 and the VQ residual (2, 3, −1).

By inversely vector-quantizing the VQ code 0 and the VQ residual (2, 3, −1), constituting the coded data obtained in the encoding unit 91, as shown in FIG. 31(A), the centroid vector (100, 100, 100) associated with the VQ code 0 and the VQ residual (2, 3, −1) are added to yield the pixel value (102, 103, 99), and thus correctly decoded to obtain the original pixel value.

Furthermore, by vector-quantizing the decoded pixel value (102, 103, 99) again, as shown in FIG. 31(A), the VQ code 0 and the VQ residual (2, 3, −1) are obtained again.

From the above, by decoding the VQ code and the VQ residual constituting the coded data to obtain correct decoding result, and re-encoding (vector quantization herein) the decoding result, the VQ code and the VQ residual obtained by the encoding coincide with the VQ code and the VQ residual constituting the coded data, respectively.

Of the VQ code 0 and VQ residual (2, 3, −1) constituting the coded data obtained in the encoding unit 91, when additional information is embedded by applying line rotation on the VQ residual (2, 3, −1) in the manner described earlier, VQ residual obtained for a different pixel is assigned as VQ residual between the VQ code 0 and the pixel associated with the VQ residual (2, 3, −1). If, for example, the VQ residual of the different pixel is (10, 11, 12) as shown in FIG. 31(B), by adding the centroid vector (100, 100, 100) and the VQ residual (10, 11, 12), the VQ code 0 and the VQ residual (10, 11, 12) are decoded as the pixel value (110, 111, 112), and are not decoded correctly into the original pixel value (102, 103, 99).

Thus, even if the incorrect decoded pixel value (110, 111, 112) is vector-quantized again, the resulting VQ code and VQ residual do not coincide with the VQ code 0 and the VQ residual (2, 3, −1) constituting the coded data, respectively, as shown in FIG. 31(B).

More specifically, in this case, since it is assumed that each of the R, B, and G components of a centroid vector in the codebook is represented by a multiple of ten, the centroid vector with the shortest distance to the pixel value (110, 111, 112) is (110, 110, 110). Thus, for example, assuming that the VQ code representing the centroid vector (110, 110, 110) is 1, the pixel value (110, 111, 112) is vector-quantized into the VQ code 1 and the VQ residual (0, 1, 2) (=(110, 111, 112)−(110, 110, 110)). In this case, neither the VQ code nor the VQ residual coincides with the VQ code or the VQ residual (10, 11, 12) constituting the original coded data.

From the above, if the number of pixels for the rotation according to the parameter in the line rotation unit 136 shown in FIG. 28 does not coincide with the additional information, that is, if the tentative coded data does not coincide with the coded data before the additional information is embedded therein, VQ code and VQ residual obtained by re-encoding the tentative decoded pixel value obtained from the tentative coded data do not coincide respectively with the VQ code and the VQ residual constituting the tentative coded data, and thus the tentative decoded pixel value obtained by decoding the tentative coded data can be determined as incorrect decoding result.

On the other hand, if the number of pixels for the rotation according to the parameter in the line rotation unit 136 shown in FIG. 28 coincides with the additional information, that is, if the tentative coded data coincides with the coded data before the additional information is embedded therein, VQ code and VQ residual obtained by re-encoding the tentative decoded pixel value obtained from the tentative coded data coincide respectively with the VQ code and the VQ residual constituting the tentative coded data, and thus the tentative decoded pixel value obtained by decoding the tentative coded data can be determined as correct decoding result.

Now, a decoding process executed by the decoder 12 shown in FIG. 26, in a case where the coding rule restoring unit 121, the decoding unit 122, and the determination unit 123 are constructed as shown in FIGS. 28 to 30, respectively, will be described with reference to a flowchart shown in FIG. 32.

In the decoding process, the DEMUX 131 of the coding rule restoring unit 121 demultiplexes data supplied thereto into compressed VQ code, VQ residual, and codebook, supplying them to the expansion unit 132. In step S71, the expansion unit 132 expands the compressed VQ code, VQ residual, and codebook supplied from the DEMUX 131, supplying the expanded VQ code, VQ residual, and codebook to and stores them in the VQ code memory 133, the VQ residual memory 134, and the codebook memory 135, respectively.

Then, in step S72, the true/false determination unit 154 of the determination unit 123 (FIG. 30) controls the parameter controller 124 (FIG. 26) to set a particular parameter value, and supplies the parameter to the coding rule restoring unit 121.

The true/false determination unit 154, for example, sequentially sets integers in a range of zero to the number of pixels on one line as the parameter value, each time the process in step S72 is executed for each line of each frame.

When the coding rule restoring unit 121 receives the parameter from the parameter controller 124, in step S73, the line rotation unit 136 rotates the VQ residual of the line under consideration to the left for the number of pixels corresponding to the parameter, supplying the VQ residual having been left-rotated, together with the VQ code of the line under consideration stored in the VQ code memory 133 and the codebook stored in the codebook memory 135, to the decoding unit 122 as tentative coded data. Furthermore, the line rotation unit 136 supplies the number of pixels for which the line under consideration is rotated to the determination unit 123 as tentative decoded additional information.

In step S74, the decoding unit 122 performs inverse vector quantization based on the VQ code, VQ residual, and codebook constituting the tentative coded data supplied from the coding rule restoring unit 121, thereby decoding the pixel values of the line under consideration, and supplies the resulting tentative decoded pixel values to the determination unit 123.

In the determination unit 123 (FIG. 30), the tentative decoded additional information output from the coding rule restoring unit 121 and the tentative decoded pixel values output from the coding rule restoring unit 121 are stored in the memory 151. Furthermore, in step S75, in the determination unit 123, the encoding unit 152 vector-quantizes the tentative decoded pixel values supplied from the decoding unit 122, and supplies the resulting tentative VQ code and tentative VQ residual to the comparison unit 153.

The comparison unit 153 compares, for each pixel of the line under consideration, the tentative VQ code supplied from the encoding unit 152 with the VQ code constituting the tentative coded data, and also compares the tentative VQ residual supplied from the encoding unit 152 with the VQ residual constituting the tentative coded data, supplying the results of the comparisons to the true/false determination unit 154. In step S76, the true/false determination unit 154 determines, for each pixel of the line under consideration, whether the tentative VQ code coincides with the VQ code constituting the tentative coded data, and whether the tentative VQ residual coincides with the VQ residual constituting the tentative coded data. If it is determined that one or neither do not coincide for one or more pixels, that is, if the value of the parameter set in the immediately preceding step S72 does not coincide with the additional information, the process returns to step S72, in which a new parameter value is set, and the same process is repeated.

If it is determined in step S76 that the tentative VQ code coincides with the VQ code constituting the tentative coded data and the tentative VQ residual coincides with the VQ residual constituting the tentative coded data for every pixel of the line under consideration, that is, if the parameter value set in the immediately preceding step S72 coincides with the additional information and if the coded data has been restored and the original additional information has been correctly decoded as the tentative decoded additional information, the process proceeds to step S77, in which the true/false determination unit 154 controls the memory 151 to output the tentative decoded pixel value and the tentative decoded additional information of each pixel of the line under consideration, stored therein, as correct decoded pixel value and decoded additional information, respectively. The process then proceeds to step S78.

In step S78, it is determined whether a line to be decoded next exists. If it is determined that a next line exists, the process returns to step S72, in which the same process is repeated with the next line to be decoded as a new line to be considered.

If it is determined in step S78 that no line exists to be decoded next, the decoding process is exited.

Figure 32:
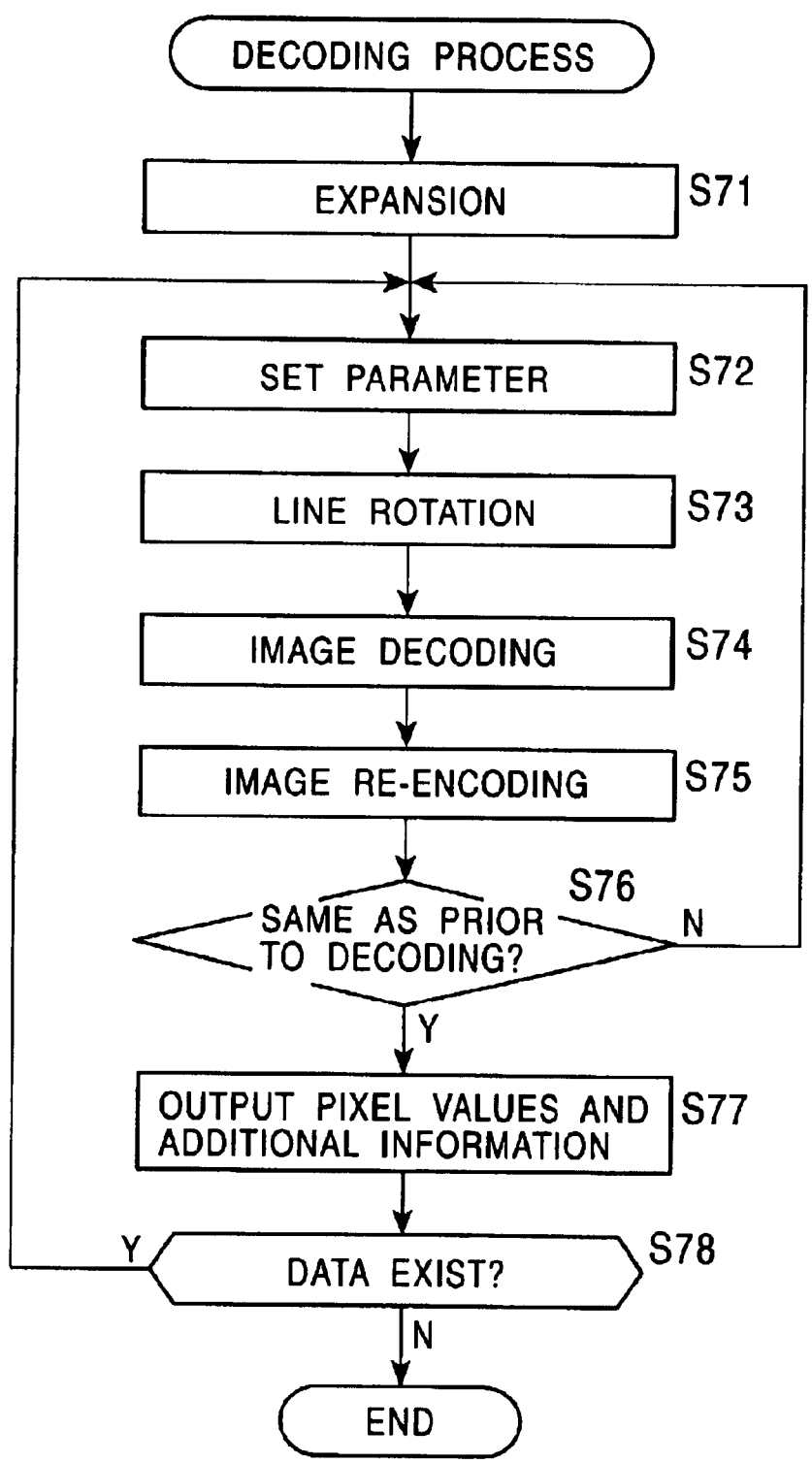
FIG. 32 is a flowchart showing a decoding process.

The decoding process shown in FIG. 32 is executed for each frame.

As described above, a coding rule for obtaining coded data is destroyed (modified) based on additional information, and embedded coded data encoded according to the destroyed coding rule is manipulated in a predetermined manner, whereby tentative coded data is obtained. The tentative coded data is decoded, and it is determined whether encoding the result of decoding yields the same data as the tentative coded data, so that coded data prior to destruction of the coding rule is restored (decoded).

Accordingly, by utilizing the destruction and restoration of the coding rule, additional information can be embedded and decoded without increasing the amount of coded data.

The applicant has already proposed, in U.S. patent application Ser. No. 09/636,138, a method for embedding additional information in an image based on, for example, correlation of images. According to the proposed method, for example, lines constituting a frame are exchanged based on additional information, and the lines of the frame that have been exchanged are restored to the original positions based on the fact that adjacent lines in the original frame are highly correlated with each other. Depending on cases, the method based on correlation has not always been successful in embedding additional information. That is, simply put, the method based on correlation, with regard to a line of a frame in which additional information is embedded, exchanges a line adjacent to the line with a line that is most highly correlated with the line under consideration, until all the lines are restored to original positions. However, in some images, a line that is most highly correlated with a line under consideration is not necessarily a line to be positioned adjacent to the line under consideration. When such lines are exchanged by embedding additional information, the lines cannot be restored to original positions based on correlation, inhibiting additional information from being embedded.

As opposed thereto, the method described earlier is not subject to such a failure of decoding.

Figure 33:
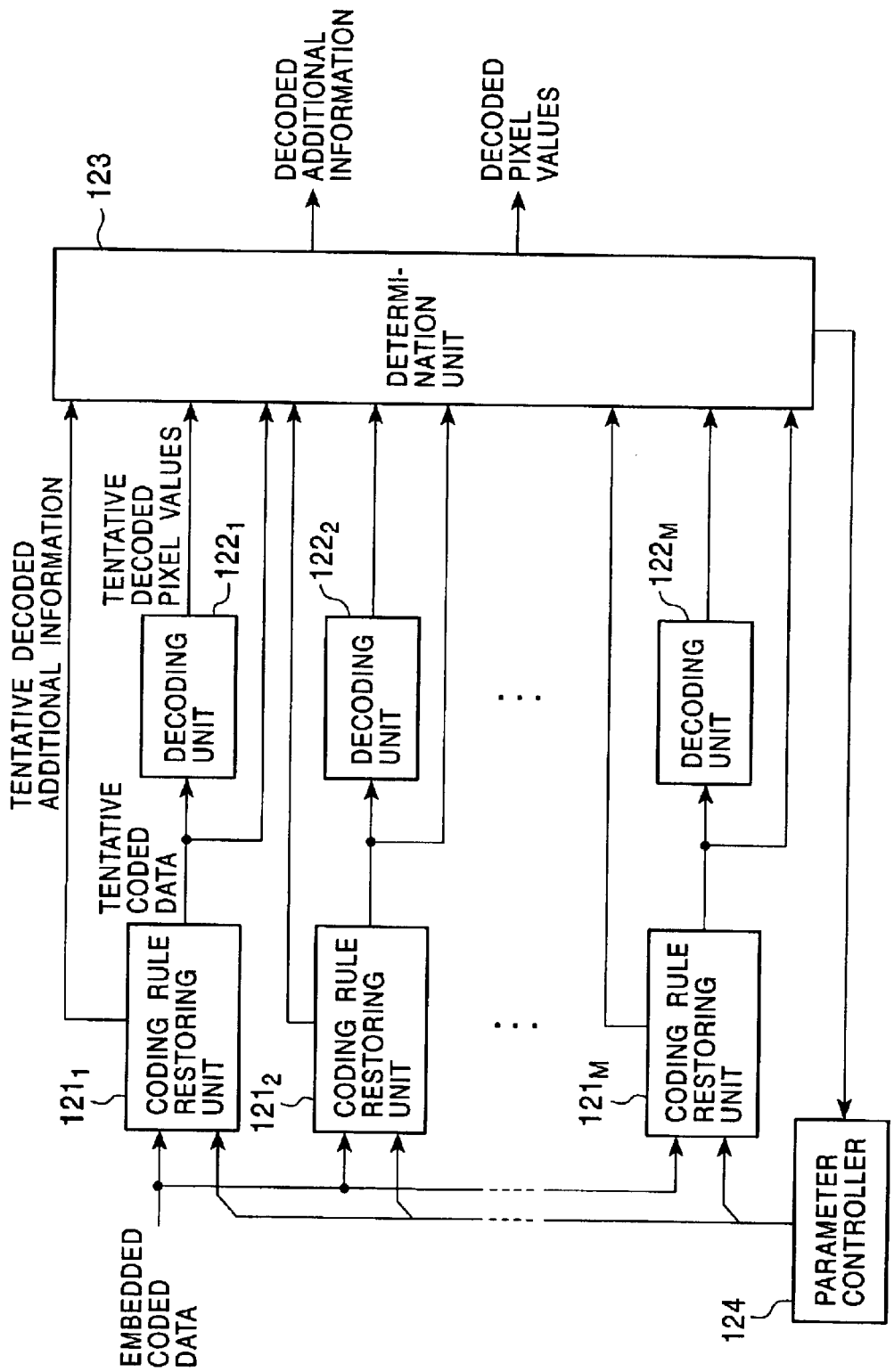
FIG. 33 is a block diagram showing a third example construction of the decoder 12.

In the embodiment shown in FIG. 26, the decoder 12 includes only a single line of the pair of the coding rule restoring unit 121 and the decoding unit 122, sequentially obtaining tentative coded data associated with various parameter values by sequentially changing parameters output from the parameter controller 124; however, for example, as shown in FIG. 33, the decoder 12 may include M lines of coding rule restoring units $121_1$ to $121_M$ and decoding units $122_1$ to $122_M$, supplying different parameter values respectively to the each coding rule restoring units $121_m$ (m=1, 2, . . . , M) so that tentative coded data respectively associated with the parameter values can be simultaneously obtained.

Furthermore, although the encoding unit 91 shown in FIG. 19 performs vector quantization in the example described above, the encoding unit 91 may perform, for example, predictive coding instead of vector quantization. In that case, the embedding unit 92 is allowed to embed additional information by manipulating prediction residual associated with predictive coding based on the additional information.

Furthermore, although additional information is embedded by rotating VQ residual of each line based on the additional information in the example described above, additional information may also be embedded, for example, by rotating a bit sequence of a value representing the VQ residual.

Furthermore, although codebooks are created and included in coded data on a frame basis in the example described above, codebooks may be created in advance and stored in each of the embedded compression encoder 11 and the decoder 12. Furthermore, codebooks may be created on a basis of a plurality of frames, or on a basis of a predetermined area of a frame.

The series of processes described above may be implemented in hardware or in software. When the series of processes is implemented in software, a program constituting the software is installed, for example, on a general-purpose computer.

Figure 34:
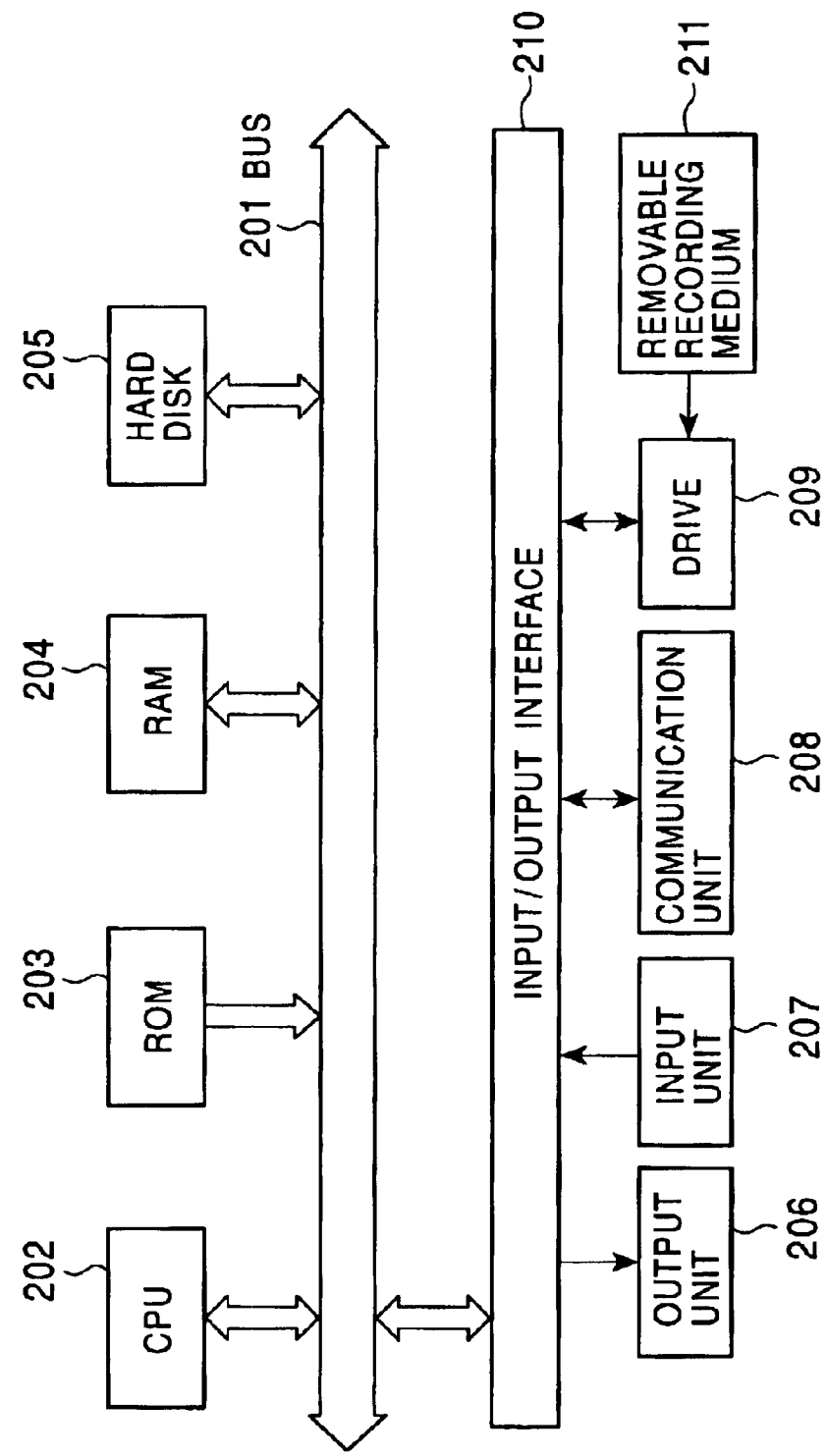
FIG. 34 is a block diagram showing an example construction of a computer according to an embodiment of the present invention.

FIG. 34 shows an example construction of a computer on which a program for executing the series of processes described above is installed.

The program may be stored in advance in a recording medium incorporated in the computer, such as a hard disc 205 or a ROM 203.

Alternatively, the program may be temporarily or permanently stored (recorded) on a removable storage medium 211 such as a floppy disk, a CD-ROM (Compact Disc Read Only Memory), an MO (Magneto optical) disc, a DVD (Digital Versatile Disc), a magnetic disc, or a semiconductor memory. The removable recording medium 211 can be provided in the form of what is called package software.

Instead of installing the program on the computer from the removable recording medium 211 as described above, the program may be transferred by wireless to the computer from a downloading site via an artificial satellite for digital satellite broadcasting, or may be transferred to the computer by wired link via a network such as a LAN (Local Area Network) or the Internet, so that the computer receives the program thus transferred via a communication unit 208 and then installs the program in an internal hard disc 205.

The computer includes a CPU (Central Processing Unit) 202. To the CPU 202, an input/output interface 210 is connected via a bus 201. In response to a command input via the input/output interface 210 by a user's operation on an input unit 207 including a keyboard, a mouse, a microphone, etc., the CPU 202 executes a program stored in a ROM (Read Only Memory) 203 according to the command. Alternatively, the CPU 202 loads a program stored in the hard disc 205, a program transferred via a satellite or a network, received via the communication unit 208, and installed on the hard disc 205, or a program read from the removable recording medium 211 mounted on a drive 209 and installed on the hard disc 205, into a RAM (Random Access Memory) 204 for execution. The CPU 202 thus executes processes according to the flowcharts described above, or processes executed by the constructions shown in the block diagrams described above. The CPU 202, as required, outputs the results of the processes to an output unit 206 including an LCD (Liquid Crystal Display), a speaker, etc., transmits them via the communication unit 208, records them on the hard disc 205, etc., for example, via the input/output interface 210.

In this specification, the processing steps constituting programs for executing various processes on a computer need not necessarily be executed sequentially in the order shown in the flowcharts, and may be executed in parallel or individually (e.g., parallel processing or processes based on objects).

The program may be executed by a single computer or by distributed processing using a plurality of computers. Furthermore, the program may be transferred to and executed on a remote computer.

Although image data is encoded in the embodiment, data to be encoded is not limited to image data, and various data such as audio data and computer programs may be used.

INDUSTRIAL APPLICABILITY

According to the first data processing apparatus, data processing method, and storage medium of the present invention, first data is encoded to output coded data. Then, a portion of the coded data is modified based on the second data so that the second data is embedded in the coded data.

According to the second data processing apparatus, data processing method, and storage medium of the present invention, a coding table for encoding first data is created, and the coding table created is modified based on second data to create a modified coding table. Then, the first data is encoded based on the modified coding table to generate embedded coded data in which the second data is embedded.

According to the fifth data processing apparatus, data processing method, and storage medium of the present invention, first data is encoded according to a coding rule to output coded data. Then, the coding rule is modified based on second data, and the first data is encoded according to the modified coding rule to generate embedded coded data in which the second data is embedded.

Thus, the second data can be embedded without increasing the amount of data.

According to the third data processing apparatus, data processing method, and storage medium of the present invention, embedded coded data encoded by embedding second data in first data is tentatively decoded based on a coding table to output tentative decoded data. Furthermore, a tentative coding table is created based on the tentative decoded data, and the embedded coded data is decoded based on the coding table and the tentative coding table to obtain first decoded data. The coding table is compared with the tentative coding table to obtain second decoded data.

According to the fourth data processing apparatus, data processing method, and storage medium of the present invention, a portion of embedded coded data encoded by embedding second data in first data is modified according to an input parameter, and tentatively decoded based on a coding table to output tentative decoded data. Furthermore, the tentative decoded data is re-encoded to output re-encoded data. The parameter is determined by comparing the embedded coded data and the re-encoded data, and tentative decoded data obtained by tentatively decoding, based on the coding table, the embedded coded data having been partially modified based on the parameter, is output as first decoded data, and for second decoded data corresponding to the parameter is also obtained.

According to the sixth data processing apparatus, data processing method, and storage medium of the present invention, embedded coded data obtained by embedding second data in first data is decoded to obtain coded data encoded according to an entropy coding rule and to obtain the second data. Furthermore, the coded data is decoded to obtain the first data.

Thus, the first and the second data can be correctly decoded.

According to the data processing system of the present invention, in the encoding apparatus, first data is encoded according to a coding rule to output coded data. Then, the coding rule is modified based on second data, and the first data is encoded according to the modified coding rule to generate embedded data in which the second data is embedded. In the decoding apparatus, embedded coded data is decoded to obtain the coded data encoded according to the coding rule and to obtain the second data. Then, the coded data is decoded to obtain the first data. Thus, the second data can be embedded without increasing the amount of coded data obtained by encoding the first data. Furthermore, the data in which the second data is embedded can be correctly decoded to obtain the first and the second data.

What is claimed is:

1. A data processing apparatus comprising:
coding table creation means for statistically analyzing data values included in first data and for creating a coding table for encoding the first data into coded data based on a result of the statistical analysis;

coded data output means for generating and outputting coded data by encoding the first data based on the coding table created by said coding table creation means; and embedding means for embedding second data in the coded data output from said coding table creation means by modifying a portion of the coded data based on the second data.

2. A data processing apparatus according to claim 1, wherein said embedding means comprises:

translation table creation means for creating a translation table for translating coded data in the coding table created by said coding table creation means, based on the second data; and embedded coded data generation means for translating the coded data output from said coded data output means based on the translation table created by said translation table creation means to generate embedded coded data in which the second data is embedded.

3. A data processing apparatus according to claim 2, wherein said coding table creation means comprises:

frequency table creation means for creating and outputting a frequency table representing the frequency of each data value included in the first data;

Huffman tree creation means for creating and outputting a Huffman tree based on the frequency table output from said the frequency table creation means; and Huffman table creation means for creating a Huffman table associating each of the data values with the coded data, based on the Huffman tree created by said Huffman tree creation means;

and said coded data output means generates and outputs coded data by encoding the first data based on the Huffman table created by said Huffman table creation means.

4. A data processing apparatus according to claim 3, wherein said translation table creation means comprises:

pattern number detection means for detecting the number of patterns of coded data of each code length in the Huffman table created by said Huffman table creation means; and information amount detection means for detecting the amount of information that can be embedded in coded data of each code length in the Huffman table, based on the number of patterns detected by said pattern number detection means;

and said translation table creation means creates and outputs a translation table in which coded data of each code length in the Huffman table having been modified based on a portion of the second data in accordance with the amount of information detected by said information amount detection means is associated with coded data of each code length prior to the modification.

5. A data processing apparatus according to claim 4, wherein said embedded coded data generation means comprises code length detection means for detecting the code length of coded data under consideration in the coded data output from said coded data output means;

and said embedded coded data generation means translates the coded data under consideration into embedded coded data for output based on the translation table associated with the code length detected by said code length detection means.

6. A data processing apparatus according to claim 1, wherein said coded data output means comprises quantization means for outputting a quantization code generated by quantizing a data value included in the first data based on the coding table, and a quantization error representing an error between the quantization code and the data value.

7. A data processing apparatus according to claim 6, wherein said embedding means embeds the second data in the coded data output from said quantization means by modifying a portion of the quantization error based on the second data.

8. A data processing apparatus according to claim 7, wherein said coding table creation means comprises codebook creation means for creating and outputting a codebook including a vector quantization code representing a representative vector of a data value included in the first data;

said quantization means comprises vector quantization means for vector-quantizing each data value included in the first data based on the codebook created by said codebook creation means to output a vector quantization code, and for detecting and outputting a vector quantization error representing the difference between the data value and the representative vector represented by the vector quantization code;

and said embedding means embeds the second data in the coded data output from said vector quantization means by modifying a portion of the vector quantization error based on the second data.

9. A data processing apparatus according to claim 7, wherein said embedding means embeds the second data in the coded data output from said quantization means by rotating a portion of the quantization error based on the second data.

10. A data processing apparatus comprising:

coding table creation means for statistically analyzing data values included in first data and for creating a coding table for encoding the first data based on a result of the statistical analysis;

modified coding table creation means for modifying the coding table created by said coding table creation means based on second data to create a modified coding table; and embedded coded data generation means for encoding the first data based on the modified coding table to generate embedded coded data in which the second data is embedded.

11. A data processing apparatus according to claim 10, wherein said modified coding table creation means comprises translation table creation means for creating a translation table for translating coded data in the coding table created by said coding table creation means based on the second data, and said modified coding table creation means creates a modified coding table by translating a portion of the coding table based on the translation table created by said translation table creation means.

12. A data processing apparatus according to claim 11, wherein said coding table creation means comprises:

frequency table creation means for creating and outputting a frequency table representing a frequency of each data value included in the first data;

Huffman tree creation means for creating and outputting a Huffman tree based on the frequency table output from said frequency table creation means; and Huffman table creation means for creating a Huffman table associating each data value with the coded data, based on the Huffman tree created by said Huffman tree creation means;

and said modified coding table creation means creates a modified Huffman table by translating a portion of the Huffman table created by said Huffman table creation means.

13. A data processing apparatus according to claim 12, wherein said translation table creation means comprises:
pattern number detection means for detecting the number of patterns of coded data of each code length in the Huffman table created by said Huffman table creation means; and
information amount detection means for detecting the amount of information that can be embedded in coded data of the code length in the Huffman table, based on the number of patterns detected by said pattern number detection means;
and said translation table creation means creates and outputs a translation table in which coded data of each code length in the Huffman table having been modified based on a portion of the second data in accordance with the amount of information detected by said information amount detection means is associated with coded data of each code length prior to the modification.

14. A data processing apparatus according to claim 13, wherein said embedded coded data generation means translates the first data into embedded coded data for output based on the modified Huffman table created by said modified coding table creation means.

15. A data processing apparatus comprising:
tentative decoding means for tentatively decoding embedded coded data encoded by embedding second data in first data, based on a coding table, to output tentative decoded data;
tentative coding table creation means for creating a tentative coding table based on the tentative decoded data;
first decoded data obtaining means for decoding the embedded coded data based on the coding table and the tentative coding table to obtain first decoded data; and
second decoded data obtaining means for obtaining second decoded data by comparing the coding table with the tentative coding table.

16. A data processing apparatus according to claim 15, wherein said tentative decoding means comprises:
Huffman tree creation means for creating a Huffman tree based on a frequency table that is input together with the embedded coded data; and
Huffman table creation means for creating a Huffman table associating a data value in the first data with coded data, based on the Huffman tree created by said Huffman tree creation means;
and said tentative decoding means decodes the embedded coded data based on the Huffman table to output embedded decoded data.

17. A data processing apparatus according to claim 16, wherein said tentative coding table creation means comprises:
further frequency table creation means for creating a further frequency table representing the frequency of occurrence of each data value in the embedded decoded data based on the embedded decoded data;
further Huffman tree creation means for creating a further Huffman tree based on the further frequency table created by said further frequency table creation means; and
further Huffman table creation means for creating a further Huffman table associating a data value in the first data with embedded coded data, based on the further Huffman tree created by said further Huffman tree creation means.

18. A data processing apparatus according to claim 17 further comprising:
comparison means for comparing the frequencies in the frequency table and the further frequency table to create a data value association table associating the same data values with each other; and
translation table creation means for creating a modified table associating coded data and embedded coded data respectively associated with the data values associated with each other by the data value association table created by said comparison means, based on the Huffman table and the further Huffman table;
wherein said second decoded data obtaining means obtains the second decoded data based on the association between the coded data and the embedded coded data in the translation table.

19. A data processing apparatus according to claim 18, wherein said first decoded data obtaining means comprises coded data output means for translating the embedded coded data into coded data based on the association between the coded data and the embedded coded data in the translation table, and for outputting the coded data,
and said first decoded data obtaining means decodes the coded data output from said coded data output means based on the Huffman table to obtain the first decoded data.

20. A data processing apparatus comprising:
tentative decoding means for modifying a portion of embedded coded data encoded by embedding second data in first data according to an input parameter, and for tentatively decoding it based on a coding table to output tentative decoded data;
re-encoding means for re-encoding the tentative decoded data to output re-encoded data; and
decoding means for determining the parameter by comparing the embedded coded data and the re-encoded data, outputting tentative decoded data as first decoded data, obtained by tentatively decoding, based on the coding table, the embedded coded data having been partially modified by said tentative decoding means based on the parameter, and for obtaining second decoded data corresponding to the parameter.

21. A data processing apparatus according to claim 20, wherein said tentative decoding means modifies a quantization error of coded data including quantization code and quantization error based on the parameter, and tentatively decodes the coded data based on a coding table to output tentative decoded data.

22. A data processing apparatus according to claim 21, wherein said tentative decoding means rotates a portion of a vector quantization error of coded data including vector quantization code and vector quantization error based on the parameter, and tentatively decodes it based on a codebook to output tentative decoded data.

23. A data processing apparatus according to claim 22, wherein said tentative decoding means comprises:
inverse vector quantization means for decoding the vector quantization code based on the codebook to output inverse vector quantization data; and addition means for adding the rotated vector quantization error to the inverse vector quantization data output from said inverse vector quantization means to obtain the tentative decoded data.

24. A data processing apparatus according to claim 22, wherein said re-encoding means comprises re-vector quantization means for performing vector quantization to detect, based on the codebook, a tentative vector quantization code representing a representative vector that is most approximate to the tentative decoded data, and for detecting a tentative vector quantization error representing the difference between the tentative decoded data and the representative vector represented by the vector quantization code.

25. A data processing apparatus according to claim 24, wherein said decoding means comprises comparison means for comparing the vector quantization code with the tentative vector quantization code and for comparing the vector quantization error and the tentative vector quantization error, and when the comparisons by said comparison means result in coincidence, said decoding means outputs second decoded data corresponding to the parameter representing the amount of movement by the rotation of the vector quantization error, and also outputs the tentative decoded data as first decoded data, whereas when the comparisons do not result in coincidence, said decoding means modifies the parameter representing the amount of movement by the rotation of the vector quantization error, and supplies it to said tentative decoding means.

26. A data processing apparatus according to claim 20, comprising a plurality of said tentative decoding means, to which different parameters are respectively input, wherein said decoding means selects one of the plurality of said tentative decoding means in accordance with the result of the comparison between the embedded coded data and the re-encoded data, outputting the tentative decoded data output from the selected one of said tentative decoding means as first decoded data, and also outputting second decoded data corresponding to the parameter input to the selected one of said tentative decoding means.

27. A data processing apparatus comprising:

encoding means for encoding first data according to a compression coding rule to output coded data; and modification means for modifying the compression coding rule based on second data;

wherein said encoding means encodes the first data according to the compression coding rule modified by said modification means, thereby generating embedded coded data in which the second data is embedded.

28. A data processing apparatus according to claim 27, wherein said encoding means performs variable-length encoding according to a coding rule in which each data value included in the first data is assigned a coded data having a length based on the frequency of occurrence of the data value.

29. A data processing apparatus according to claim 28, wherein said modification means modifies, based on the second data, coded data associated with data values to which coded data of the same length are assigned.

30. A data processing apparatus according to claim 29, wherein said modification means modifies, based on the second data, coded data associated with data values to which coded data of the same length are assigned in a coding table associating each data value with coded data to be assigned to the data value based on the frequency of occurrence of each data value in the first data, thereby modifying the coding table to create a modified table, and said encoding means generates embedded coded data by encoding the first data according to the modified table.

31. A data processing apparatus according to claim 27, wherein said modification means manipulates, based on the second data, a quantization code and a quantization error output by quantizing the first data, so that the quantization code and the quantization error cause a mismatch, and said encoding means outputs the manipulated quantization code and quantization error as embedded coded data.

32. A data processing apparatus according to claim 27, wherein the first data is image data.

33. A data processing apparatus comprising:

first decoding means for decoding embedded coded data obtained by embedding second data in first data, to obtain coded data encoded according to an entropy coding rule and to obtain the second data; and second decoding means for decoding the coded data to obtain the first data.

34. A data processing apparatus according to claim 33, wherein said first decoding means decodes the embedded coded data to obtain coded data variable-length encoded according to an entropy coding rule in which coded data of a length based on the frequency of occurrence of each data value in the first data is assigned.

35. A data processing apparatus according to claim 34, wherein said first decoding means modifies coded data associated with each data value in the first data, to which coded data of the same length is assigned, based on the frequency of occurrence of each data value in the first data and the frequency of occurrence of each data value in decoded data obtained by variable-length decoding the embedded coded data, thereby restoring the embedded coded data into the coded data variable-length encoded according to the entropy coding rule.

36. A data processing apparatus according to claim 35, wherein said first decoding means comprises translation table creation means for creating a translation table for translating coded data in a coding table for variable-length encoding the first data into coded data, based on the frequency of occurrence of each data value in the first data and the frequency of occurrence of each data value in decoded data obtained by variable-length decoding the embedded coded data.

37. A data processing apparatus according to claim 33, wherein said first decoding means decodes the embedded coded data to obtain tentative coded data, said second decoding means decodes the tentative coded data to output tentative decoded data, said data processing apparatus further comprising determination means for determining whether the tentative decoded data is correct.

38. A data processing apparatus according to claim 37, wherein said determination means determines whether the tentative decoded data is correct by encoding the tentative decoded data according to the entropy coding rule.

39. A data processing apparatus according to claim 38, wherein said determination means determines whether the tentative decoded data is correct by comparing re-encoded data obtained by encoding the tentative decoded data according to the entropy coding rule with the tentative coded data.

40. A data processing apparatus according to claim 37, wherein said first decoding means decodes the embedded coded data obtained by manipulating, based on the second data, a quantization error of coded data including quantization code and quantization error obtained by quantizing the first data, by manipulating the quantization error, thereby obtaining the tentative coded data.

41. A data processing apparatus according to claim 40, wherein said determination means determines whether a quantization code and a quantization error constituting the tentative coded data are correct by comparing the quantization code and the quantization error constituting the tentative coded data with a re-quantization code and a re-quantization error obtained by re-quantizing tentative decoded data obtained by decoding the quantization code and the quantization error.

42. A data processing apparatus according to claim 33, wherein the first data is image data.

43. A data processing system comprising an encoding apparatus comprising:
encoding means for encoding first data according to a compression coding rule to output coded data; and
modification means for modifying the compression coding rule based on second data;
wherein said encoding means encodes the first data according to the compression coding rule modified by said modification means to generate embedded data in which the second data is embedded,
said data processing system also comprising a decoding apparatus comprising:
first decoding means for decoding embedded coded data to obtain the coded data encoded according to the compression coding rule and to obtain the second data; and
second decoding means for decoding the coded data to obtain the first data.

44. A data processing method comprising the steps of:
statistically analyzing data values included in first data and creating a coding table for encoding the first data into coded data based on a result of the statistical analysis;
generating and outputting coded data by encoding the first data based on the coding table created; and
embedding second data in the outputted coded data by modifying a portion of the outputted coded data based on the second data.

45. A data processing method comprising the steps of:
statistically analyzing data values included in first data and creating a coding table for encoding the first data into coded data based on a result of the statistical analysis;
modifying the coding table created based on second data to create a modified coding table; and
encoding the first data based on the modified coding table to generate embedded coded data in which the second data is embedded.

46. A data processing method,
wherein embedded coded data encoded by embedding second data in first data is tentatively decoded based on a coding table to output tentative decoded data,
a tentative coding table is created based on the tentative decoded data,
the embedded coded data is decoded based on the coding table and the tentative coding table to obtain first decoded data,
and the coding table is compared with the tentative coding table to obtain second decoded data.

47. A data processing method,
wherein a portion of embedded coded data encoded by embedding second data in first data is modified according to an input parameter, and tentatively decoded based on a coding table to output tentative decoded data,
the tentative decoded data is re-encoded to output re-encoded data,
and the parameter is determined by comparing the embedded coded data and the re-encoded data, and tentative decoded data obtained by tentatively decoding, based on the coding table, the embedded coded data having been partially modified based on the parameter, is output as first decoded data, and for second decoded data corresponding to the parameter is also obtained.

48. A data processing method,
wherein first data is encoded according to a compression coding rule to output coded data,
the coding rule is modified based on second data,
and the first data is encoded according to the modified coding rule to generate embedded coded data in which the second data is embedded.

49. A data processing method,
wherein embedded coded data obtained by embedding second data in first data is decoded to obtain coded data encoded according to an entropy coding rule and to obtain the second data,
and the coded data is decoded to obtain the first data.

50. A storage medium storing a program readable by a processing device to carry out a method comprising the steps of:
statistically analyzing data values included in first data and creating a coding table for encoding the first data into coded data based on a result of the statistical analysis;
generating and outputting coded data by encoding the first data based on the coding table created; and
embedding second data in the outputted coded data by modifying a portion of the outputted coded data based on the second data.

51. A storage medium storing a program readable by a processing device to carry out a method comprising the steps of:
statistically analyzing data values included in first data and creating a coding table for encoding the first data into coded data based on a result of the statistical analysis;
modifying the coding table created based on second data to create a modified coding table; and
encoding the first data based on the modified coding table to generate embedded coded data in which the second data is embedded.

52. A storage medium storing a program,
wherein embedded coded data encoded by embedding second data in first data is tentatively decoded based on a coding table to output tentative decoded data,
a tentative coding table is created based on the tentative decoded data, the embedded coded data is decoded based on the coding table and the tentative coding table to obtain first decoded data, and the coding table is compared with the tentative coding table to obtain second decoded data.

53. A storage medium storing a program, wherein a portion of embedded coded data encoded by embedding second data in first data is modified according to an input parameter, and tentatively decoded based on a coding table to output tentative decoded data, the tentative decoded data is re-encoded to output re-encoded data, and the parameter is determined by comparing the embedded coded data and the re-encoded data, and tentative decoded data obtained by tentatively decoding, based on the coding table, the embedded coded data having been partially modified based on the parameter, is output as first decoded data, and for second decoded data corresponding to the parameter is also obtained.

54. A storage medium storing a program, wherein first data is encoded according to a compression coding rule to output coded data, the coding rule is modified based on second data, and the first data is encoded according to the modified coding rule to generate embedded coded data in which the second data is embedded.

55. A storage medium storing a program, wherein embedded coded data obtained by embedding second data in first data is decoded to obtain coded data encoded according to an entropy coding rule and to obtain the second data, and the coded data is decoded to obtain the first data.

* * * * *